United States Patent
Cheng et al.

(10) Patent No.: US 11,264,503 B2
(45) Date of Patent: Mar. 1, 2022

(54) METAL GATE STRUCTURES OF SEMICONDUCTOR DEVICES

(71) Applicant: Taiwan Semiconductor Manufacturing Co., Ltd., Hsinchu (TW)

(72) Inventors: Chung-Liang Cheng, Changhua County (TW); Ziwei Fang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 26 days.

(21) Appl. No.: 16/718,862

(22) Filed: Dec. 18, 2019

(65) Prior Publication Data
US 2021/0193828 A1    Jun. 24, 2021

(51) Int. Cl.
| *H01L 29/78* | (2006.01) |
| *H01L 21/8234* | (2006.01) |
| *H01L 29/66* | (2006.01) |
| *H01L 29/06* | (2006.01) |
| *H01L 27/088* | (2006.01) |

(52) U.S. Cl.
CPC .... *H01L 29/785* (2013.01); *H01L 21/823412* (2013.01); *H01L 21/823431* (2013.01); *H01L 21/823462* (2013.01); *H01L 27/0886* (2013.01); *H01L 29/0665* (2013.01); *H01L 29/66795* (2013.01)

(58) Field of Classification Search
CPC ....... H01L 21/823431; H01L 21/82345; H01L 21/823456; H01L 21/823821; H01L 21/823828; H01L 21/82385; H01L 27/0886; H01L 27/092; H01L 29/0665; H01L 29/0669; H01L 29/0673; H01L 29/41791; H01L 29/66545; H01L 29/66795; H01L 29/785; H01L 2029/7858
See application file for complete search history.

(56) References Cited

U.S. PATENT DOCUMENTS

| 9,379,026 | B2 * | 6/2016 | Lin | H01L 21/82345 |
| 10,461,167 | B2 * | 10/2019 | Lee | H01L 27/092 |

(Continued)

*Primary Examiner* — Shahed Ahmed
*Assistant Examiner* — Sun Mi Kim King
(74) *Attorney, Agent, or Firm* — Sterne, Kessler, Goldstein & Fox P.L.L.C.

(57) ABSTRACT

A method of fabricating a semiconductor device includes forming first and second nanostructured layers arranged in an alternating configuration on a substrate, forming first and second nanostructured channel regions in the first nanostructured layers, forming first and second gate-all-around structures wrapped around each of the first and second nanostructured channel regions. The forming the GAA structures includes depositing first and second gate barrier layers having similar material compositions and work function values on the first and second gate dielectric layers, forming first and second diffusion barrier layers on the first and second gate barrier layers, and doping the first and second gate barrier layers from a dopant source layer through the first and second diffusion barrier layers. The first diffusion barrier layer is thicker than the second diffusion barrier layer and the doped first and second gate barrier layers have work function values and doping concentrations different from each other.

20 Claims, 25 Drawing Sheets

(56) References Cited

U.S. PATENT DOCUMENTS

| | | | |
|---|---|---|---|
| 10,720,431 B1* | 7/2020 | Cheng | H01L 21/3086 |
| 2013/0240996 A1* | 9/2013 | Yin | H01L 29/66545 |
| | | | 257/368 |
| 2016/0225871 A1* | 8/2016 | Cheng | H01L 21/823842 |
| 2016/0240651 A1* | 8/2016 | Lee | H01L 29/66431 |
| 2017/0084507 A1* | 3/2017 | Ie | H01L 21/823431 |
| 2018/0005891 A1* | 1/2018 | Bao | H01L 29/42364 |
| 2019/0139954 A1* | 5/2019 | Cheng | H01L 21/823431 |
| 2019/0140066 A1* | 5/2019 | Lee | H01L 21/28088 |
| 2019/0378913 A1* | 12/2019 | Li | H01L 21/823462 |
| 2020/0176447 A1* | 6/2020 | Pao | H01L 29/4236 |
| 2020/0373206 A1* | 11/2020 | Cheng | H01L 29/4966 |

* cited by examiner

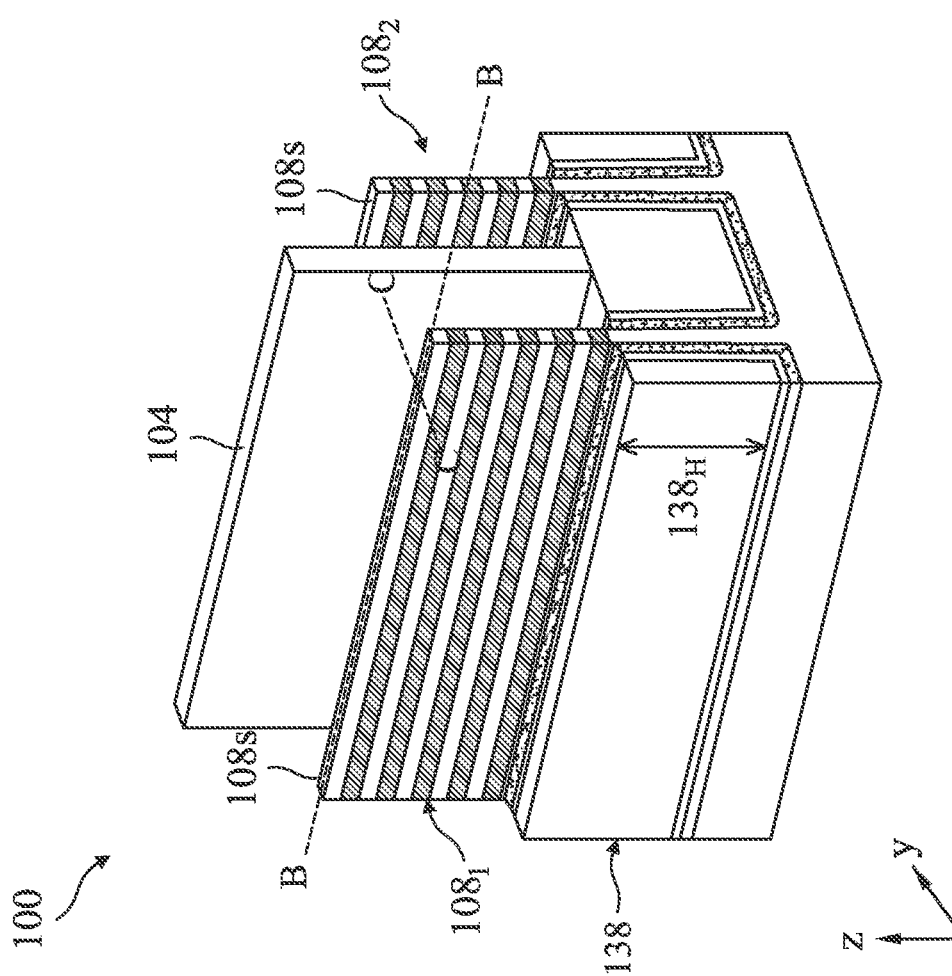

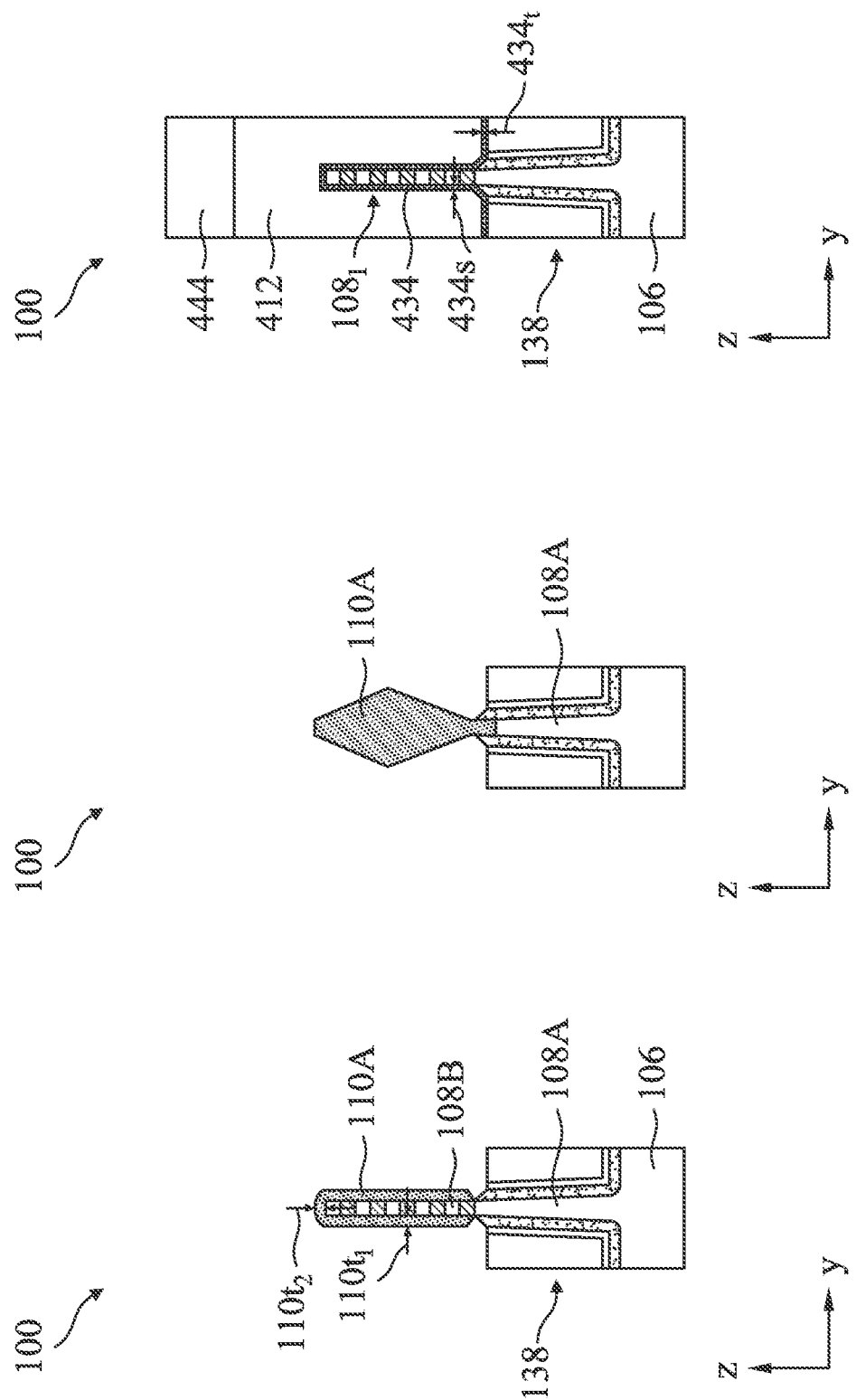

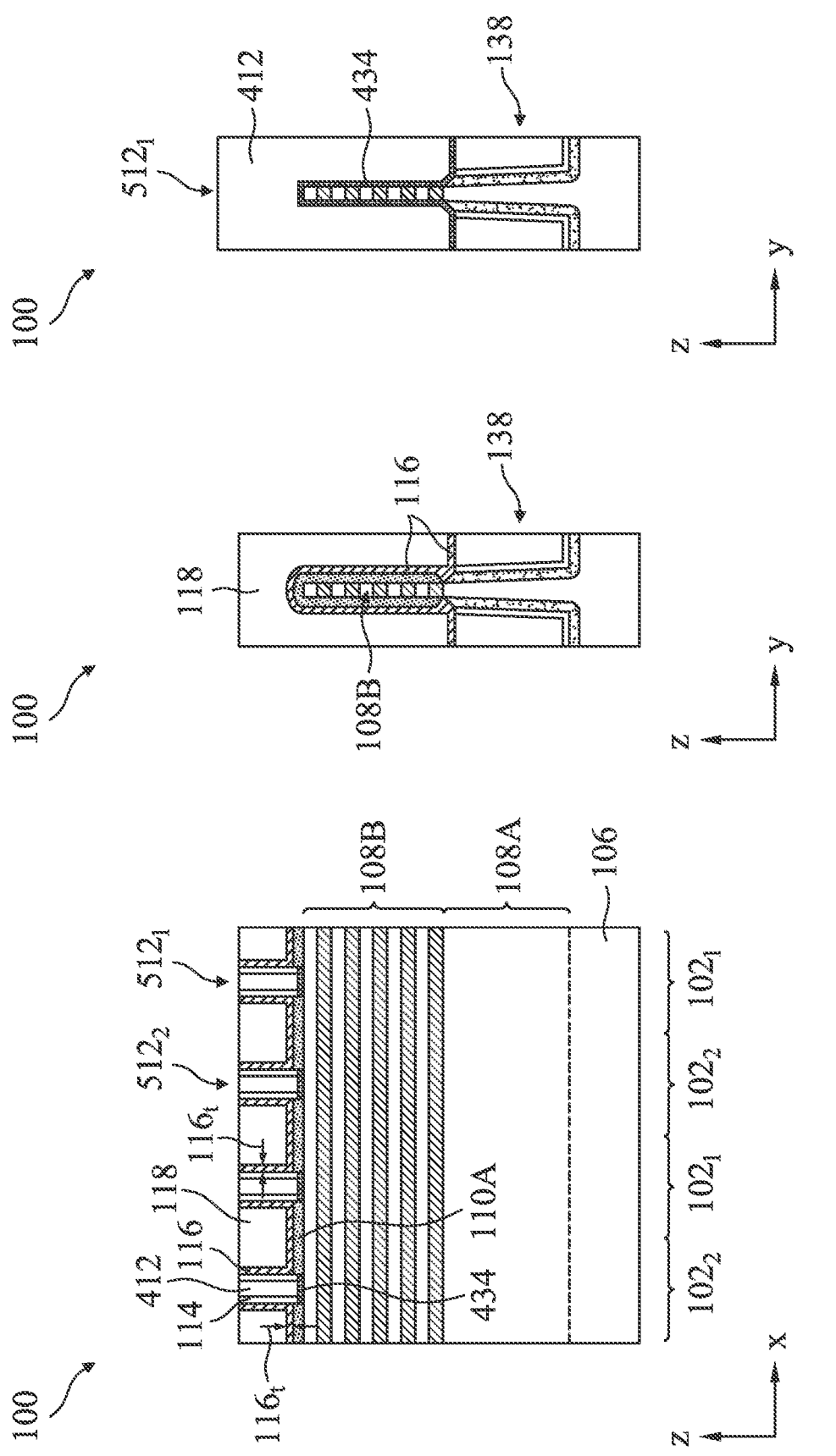

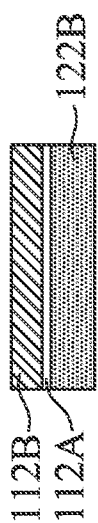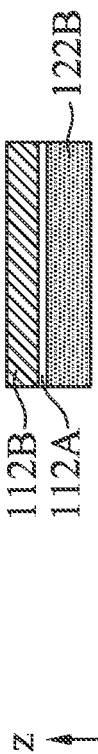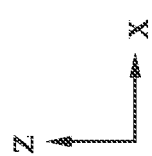
Fig. 7A
Fig. 7B
Fig. 7C
Fig. 7D

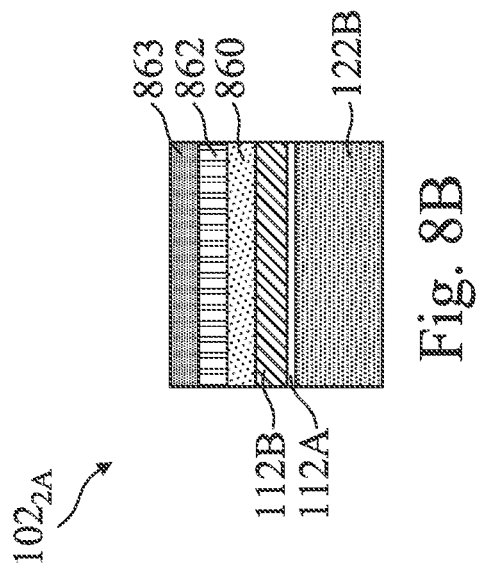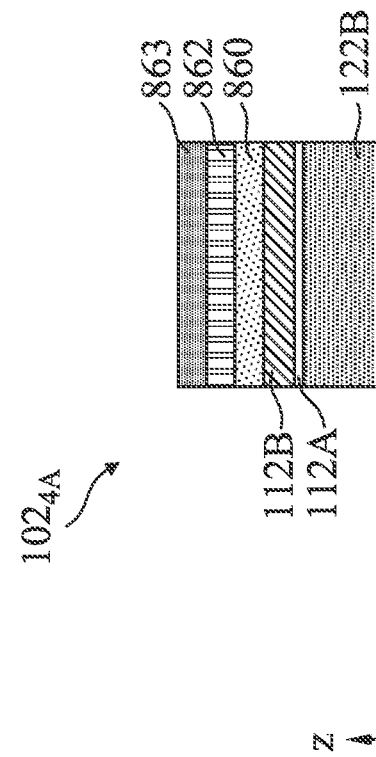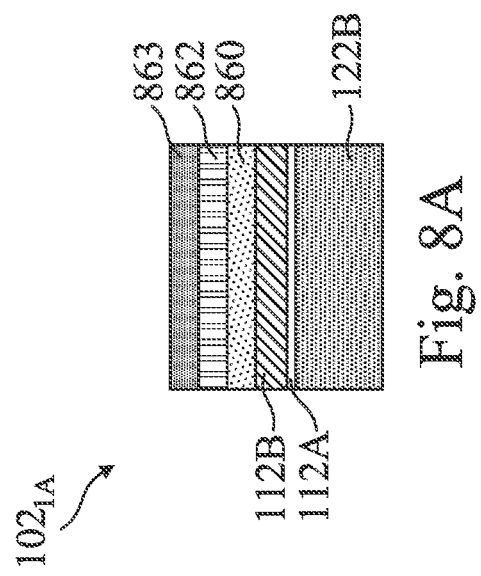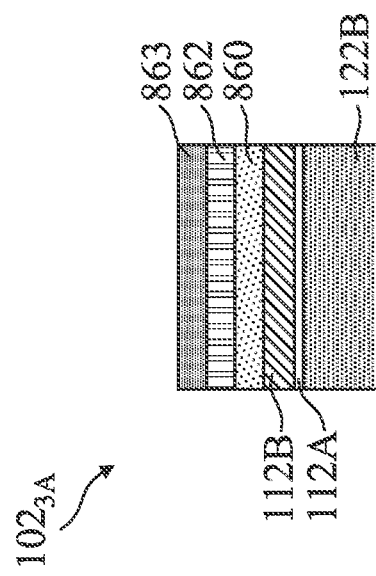

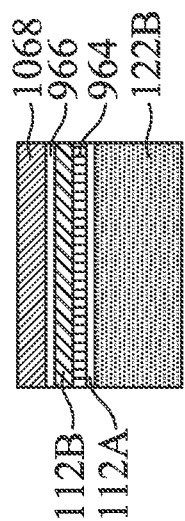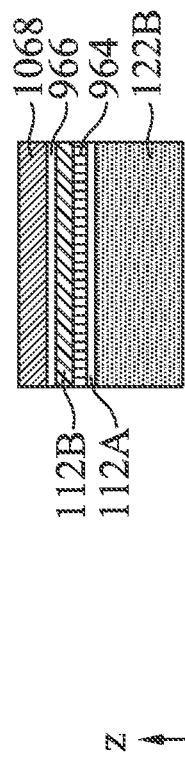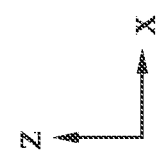
Fig. 10A  Fig. 10B  Fig. 10C  Fig. 10D

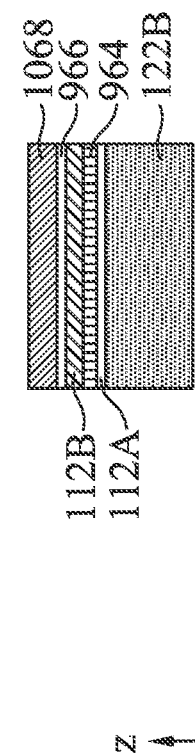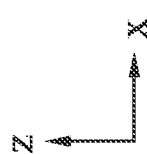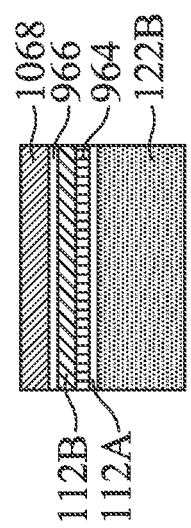

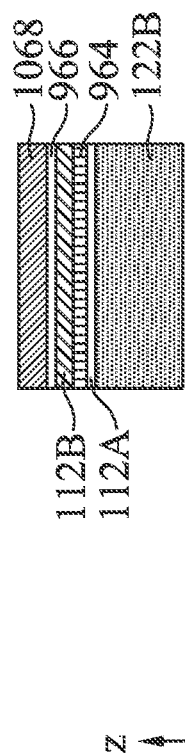

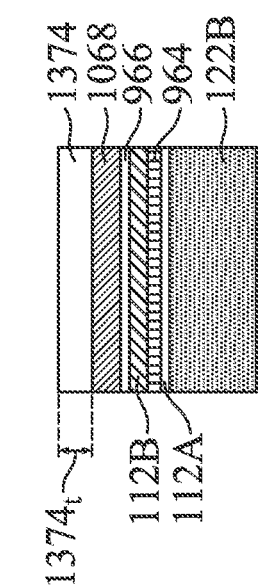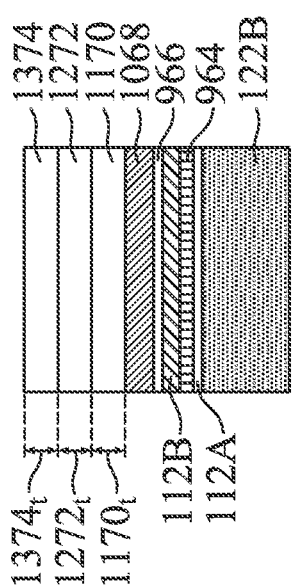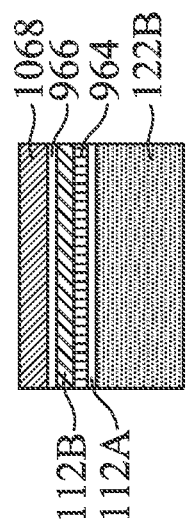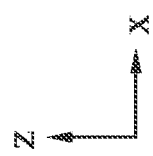

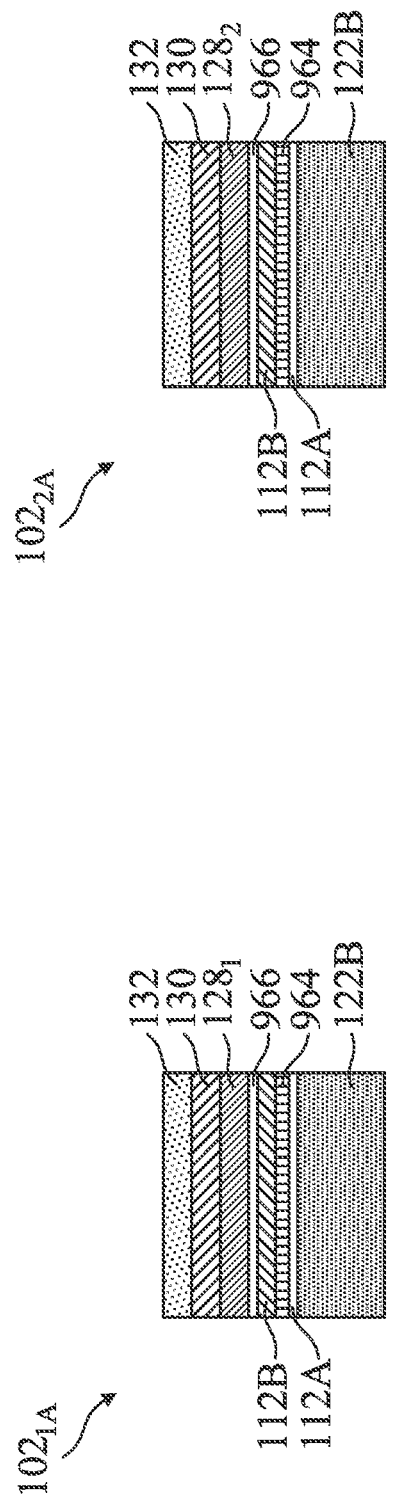
Fig. 17A
Fig. 17B
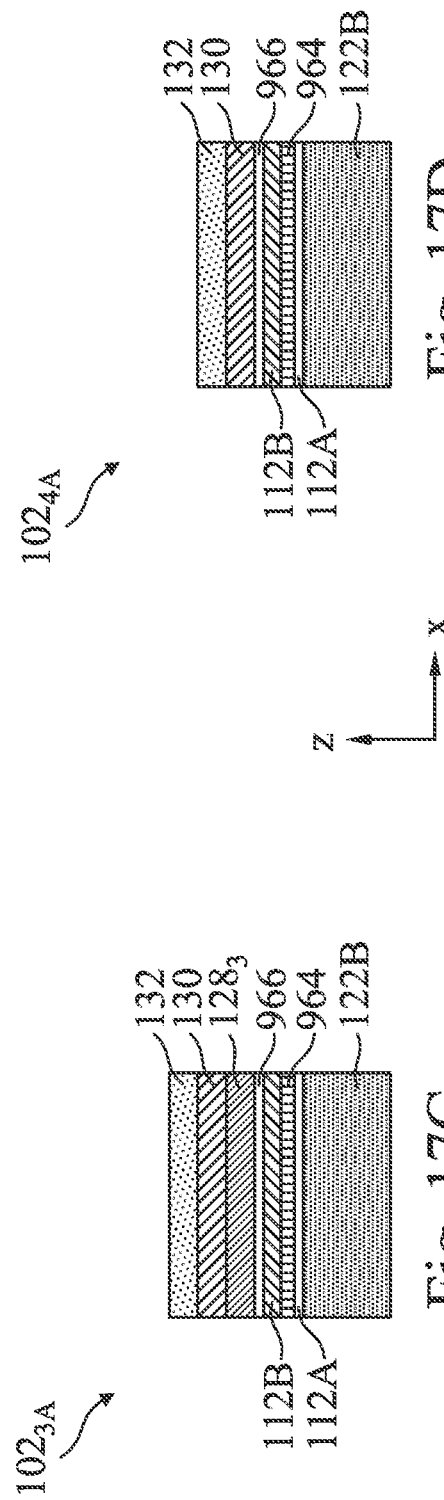
Fig. 17C
Fig. 17D

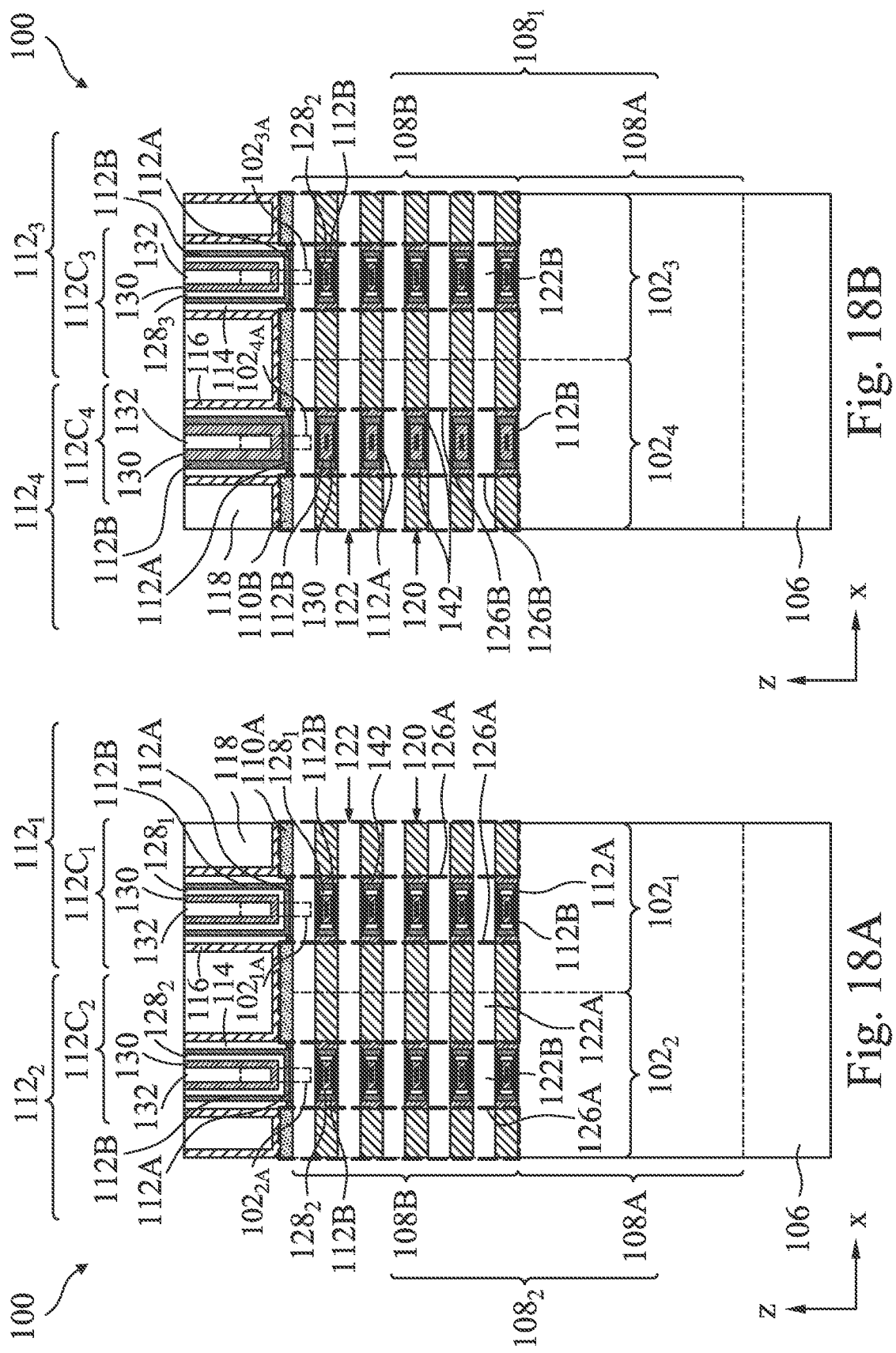

METAL GATE STRUCTURES OF SEMICONDUCTOR DEVICES

BACKGROUND

The threshold voltage of a field effect transistor (FET) (e.g., n- and/or p-type FETs) can be tuned by adjusting the thickness of work function layers within a gate structure of the FET. However, scaling the gate structure to manufacture smaller devices introduces challenges in threshold voltage tuning because adjustments to the work function layer thickness are limited due to a decrease in the FET dimensions.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 3A-6A illustrate isometric views of a semiconductor device at various stages of its fabrication process, in accordance with some embodiments.

FIGS. 3B-6B, 3C-6C, 4D-6D, and 4E illustrate cross-sectional views of a semiconductor device at various stages of its fabrication process, according to some embodiments.

FIGS. 7A-15D illustrate cross-sectional views of a gate stack of a semiconductor device at various stages of its fabrication process, according to some embodiments.

FIGS. 17A-17D illustrate cross-sectional views of a gate stack of a semiconductor device at various stages of its fabrication process, according to some embodiments.

FIGS. 18A-18B illustrate cross-sectional views of a semiconductor device, at various stages of its fabrication process, according to some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
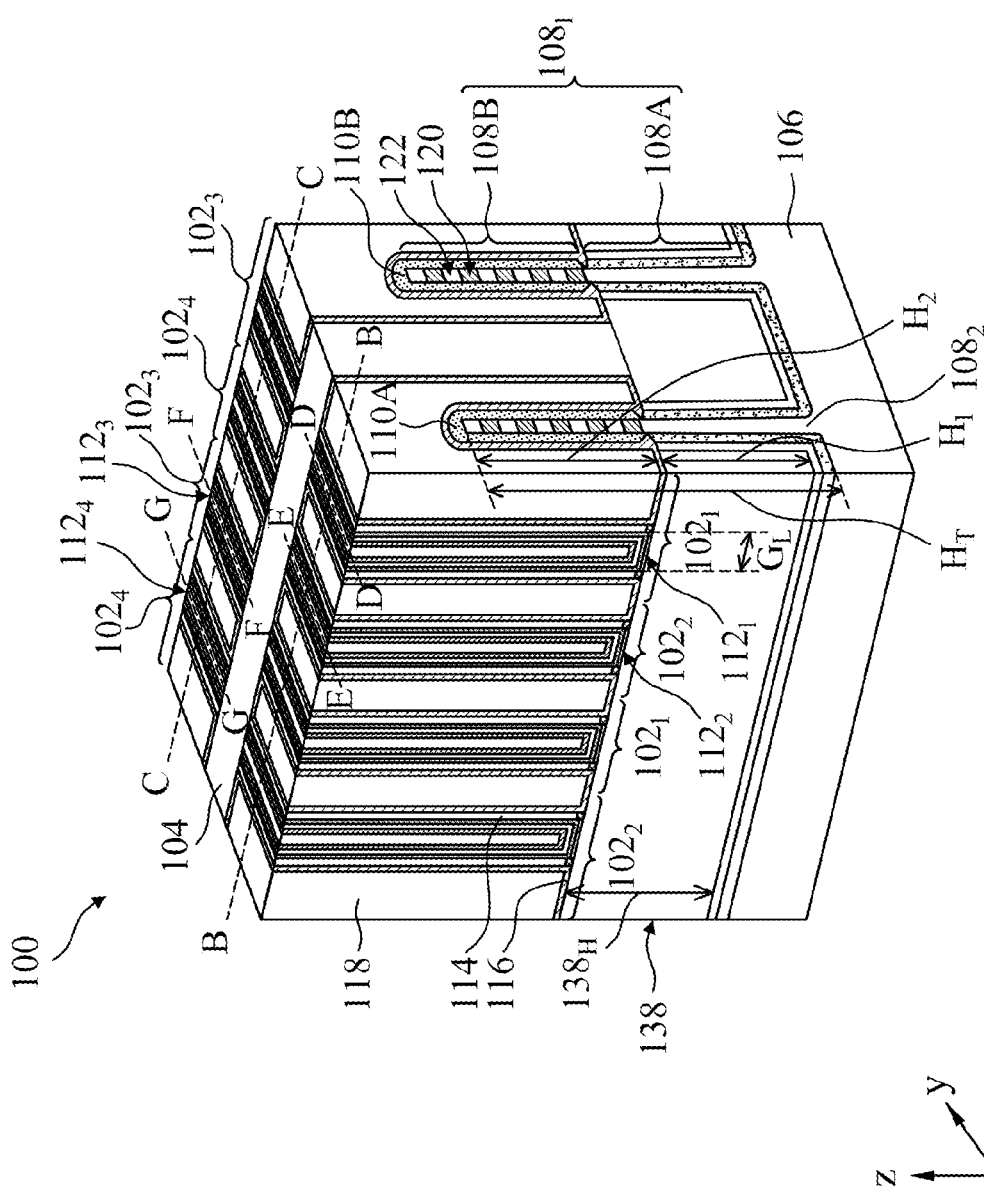
FIGS. 1A and 1B-1E illustrate an isometric view and cross-sectional views of a semiconductor device, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fins associated with fin field effect transistors (finFETs) or gate-all-around (GAA) FETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self aligned process. The sacrificial layer is then removed, and the remaining spacers may then be used to pattern the fins.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of a target value (e.g., ±1%, ±2%, ±3%, ±4%, and ±5% of the target value).

As used herein, the term "vertical," means nominally perpendicular to the surface of a substrate.

As used herein, the term "insulating layer", refers to a layer that functions as an electrical insulator (e.g., a dielectric layer).

As used herein, the term "selectivity" refers to the ratio of the etch rates of two materials under the same etching conditions.

As used herein, the term "high-k" refers to a high dielectric constant. In the field of semiconductor device structures and manufacturing processes, high-k refers to a dielectric constant that is greater than the dielectric constant of $SiO_2$, (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "insulating layer", as used herein, refers to a layer that functions as an electrical insulator (e.g., a dielectric layer).

As used herein, the term "nanostructured" defines a structure, layer, and/or region as having a horizontal dimension (e.g., along an X- and/or Y-axis) and/or a vertical dimension (e.g., along a Z-axis) less than 100 nm.

The threshold voltage of a field effect transistor (FET) can depend on the layer configuration of a gate structure of the FET. In particular, the threshold voltage of the FET can depend on the thickness and/or material composition of the stack of layers (also referred to as gate stack) included in the gate structure. Therefore, by adjusting the thickness (or the number of layers) and/or material composition of these layers in the gate stack of a FET, FETs can be manufactured with different threshold voltages. For example, FETs with a low threshold voltage, such as between about 80 mV and about 160 mV, can be used for the "low" or "ultra-low" power applications within a chip, and FETs with a high threshold voltage, such as greater than about 200 mV, can be used for high power applications within the chip. In addition, n- and p-type FETs can be manufactured with different threshold voltages that are suitable for each type of FET.

Due to the continuous device scaling and the push for low power portable devices, such as mobile phones and tablets, there is a demand for integrated circuits (ICs) with FETs having lower threshold voltages. In n-type FETs, a way to reduce (e.g., lower) the threshold voltage can be to increase the thickness of aluminum-containing n-type work function layers, such as titanium aluminum (TiAl) or titanium aluminum carbide (TiAlC) in the FET's gate stack. However, an increase in thickness of the TiAl or TiAlC layers can be limited by scaling constraints for FETs having challenging gate stack geometries. For example, the FET can be a gate-all-around (GAA) FET with one or more of the layers of the gate stack wrapped around the one or more nanostructured channel regions of the GAA FET. With the continuous device scaling, the spacing between adjacent nanostructured channel regions decreases, thus shrinking the available space for the TiAl or TiAlC layer of the gate stack of an n-type FET. As such, increasing the thickness of the TiAl or TiAlC layer in an n-type GAA FET can become challenging. For example, due to small spacing between adjacent nanostructured channel regions, such as about 8 nm to about 12 nm thicker TiAl or TiAlC layers (e.g., equal to or greater than about 2.5 nm) can lead to poor gate stack gap-fill which can in-turn lead to voids in the gate stack and variations in the gate stack resistance across the FETs.

The present disclosure provides example structures of FET's with nanostructured channel regions and different gate structures configured to provide different threshold voltages and example methods of forming such FETs on the same substrate. The example methods form FETs of different conductivity types with different work function values, and as a result, with different and/or low threshold voltages on the same substrate. Such methods can be less complicated and more cost-effective in manufacturing reliable gate structures in FETs with nanostructured channel regions and with different and/or low threshold voltages than other methods of forming FETs with similar channel dimensions and threshold voltages on the same substrate In some embodiments, the work function layer of the each FETs can include a titanium nitride layer. In some embodiments, the work function layer of one or more of the FETs can further include a tantalum nitride layer formed under the titanium nitride layer. In some embodiments, the each tantalum layer of the one or more FETs can have different aluminum doping concentration from each other. Since the aluminum doping can adjust a work function of the hosted work function layer, the adjustment of threshold voltage of the each FET can therefore have a different threshold voltage from each other. A benefit of the present disclosure is to adjust the threshold voltages of the FETs regardless of the scaling constrains of the each FETs in the IC, thus ensuring the IC's functionality requirement with advancing Moore's law.

Figure 1B:
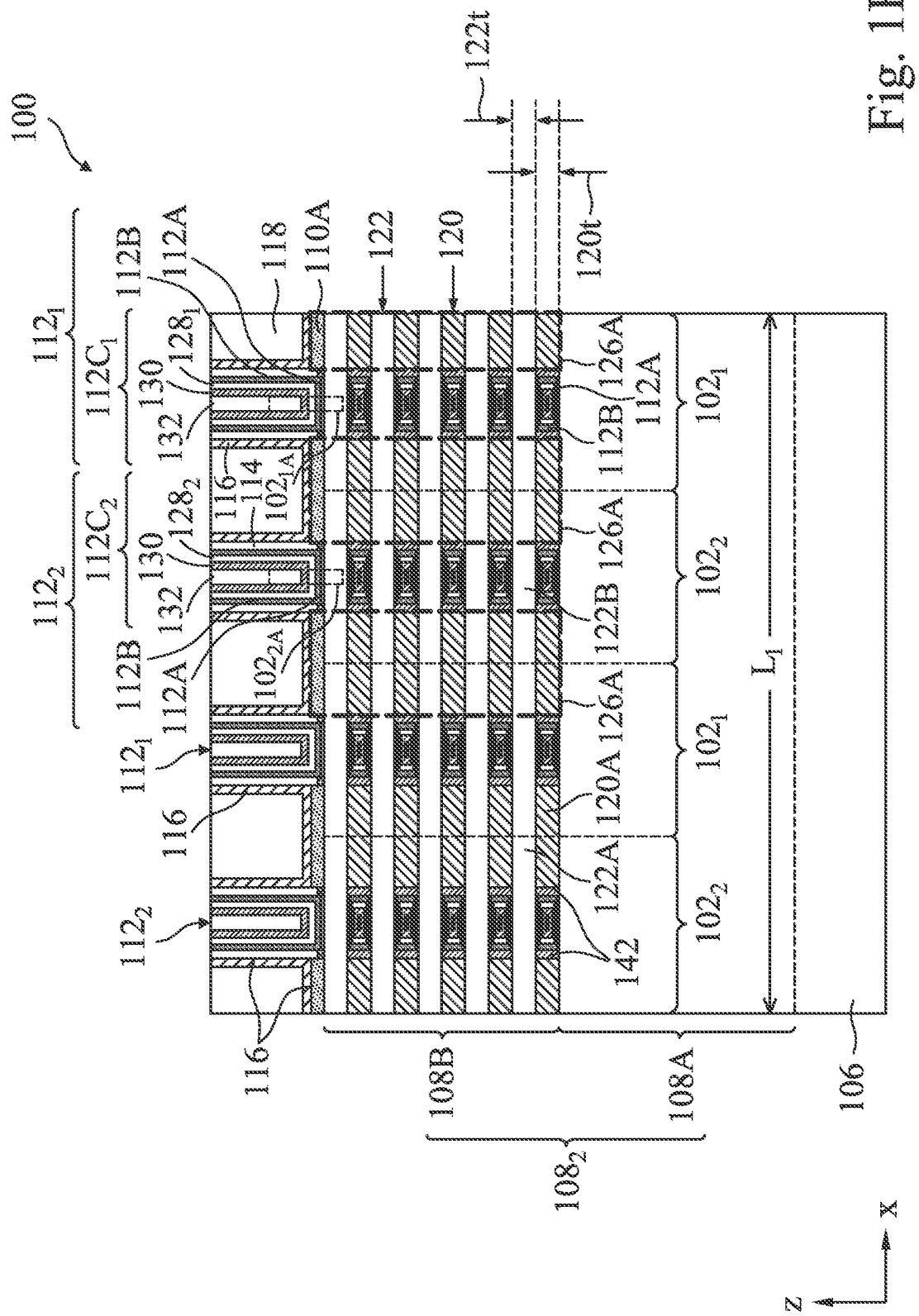
Figure 1C:
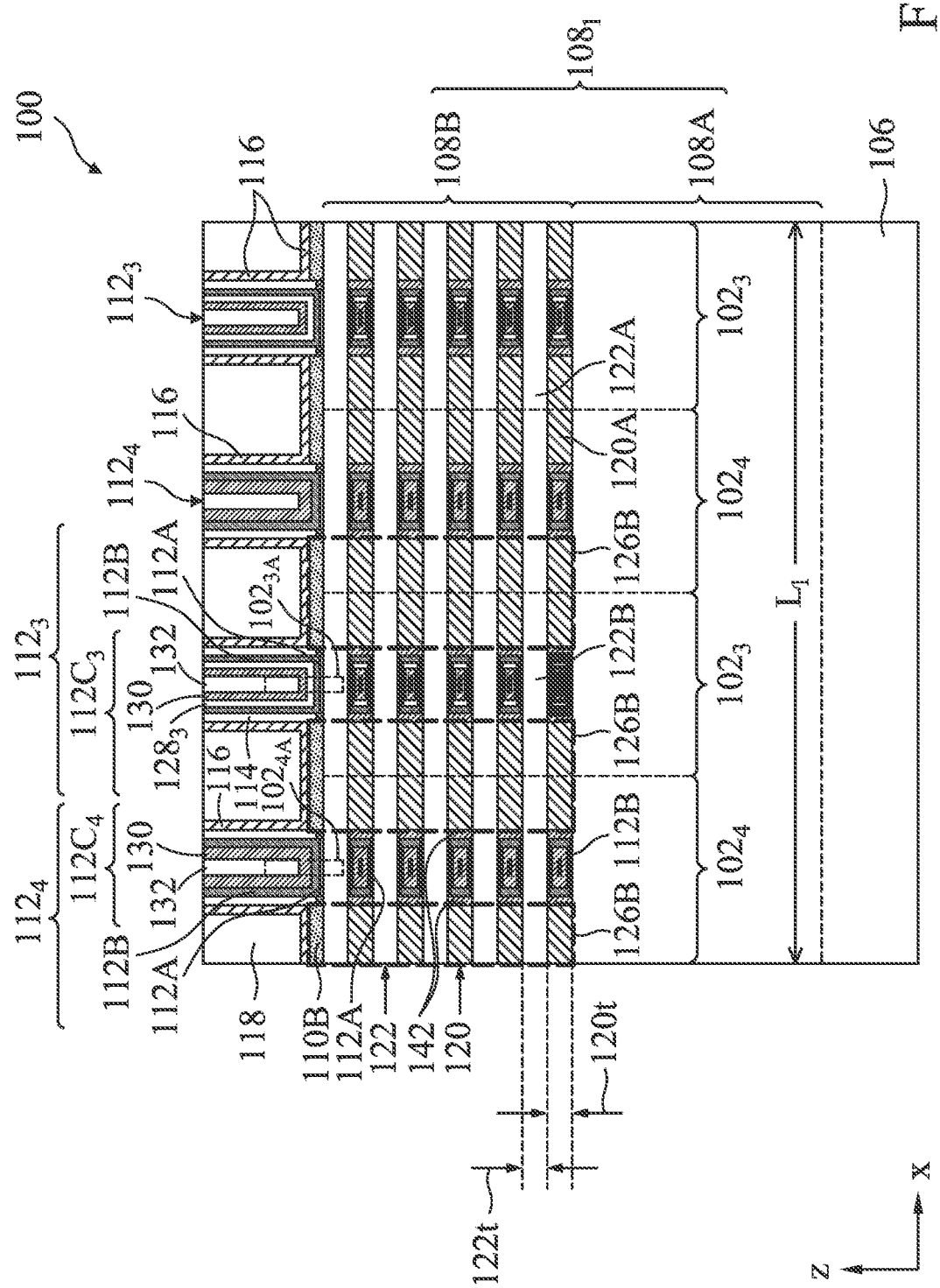
Figure 1E:
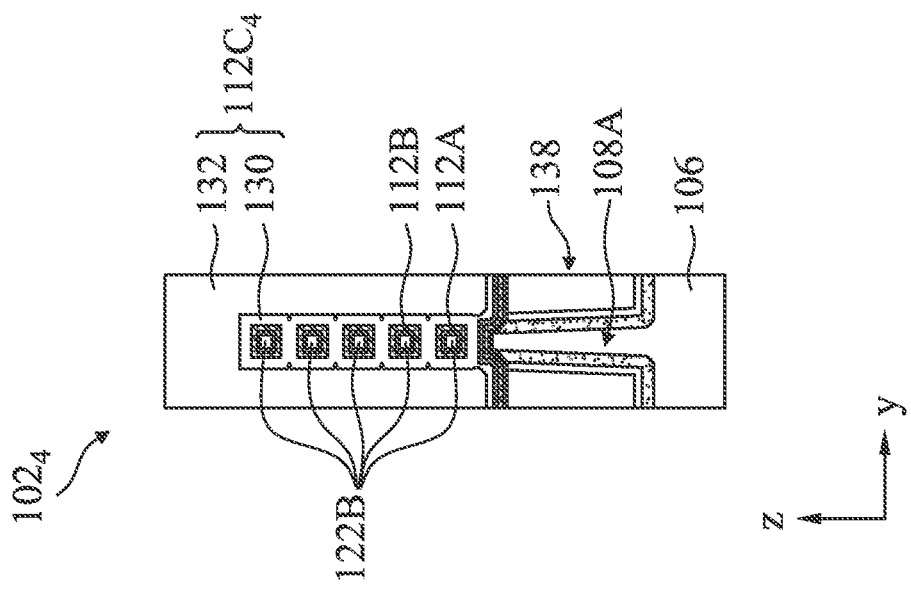
Figure 1D:
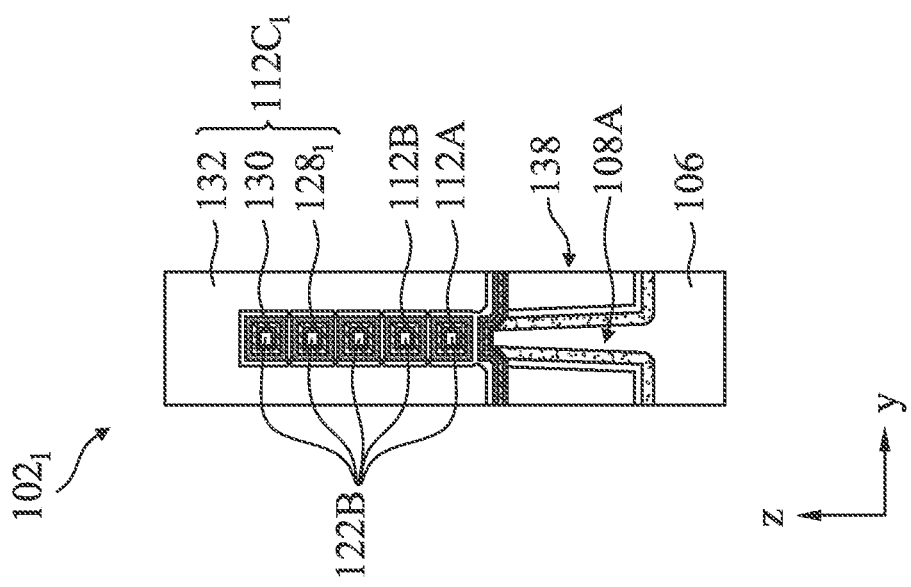

A semiconductor device 100 having FETs $102_1$-$102_4$ with respective gate structures $112_1$-$112_4$ configured to provide threshold voltages different from each other to FETs $102_1$-$102_4$, respectively, is described with reference to FIGS. 1A-1E, according to some embodiments. FIG. 1A illustrates an isometric view of semiconductor device 100, according to some embodiments. FIGS. 1B-1C illustrate cross-sectional views along lines B-B and C-C, respectively, of semiconductor device 100 of FIG. 1A, according to some embodiments. FIGS. 1D-1E illustrate cross-sectional views along lines D-D and G-G, respectively, of semiconductor device 100 of FIG. 1A, according to some embodiments. The cross-sectional views along respective lines E-E and F-F of FIG. 1A can be similar to the cross-sectional view in FIG. 1D. In some embodiments, each of FETs $102_1$-$102_4$ can be a finFET or a GAA FET. Though, in some embodiments, FETs $102_1$-$102_2$ are described herein as n-type FETs (NFETs) and FETs $102_3$-$102_4$ are described herein as p-type FETs (PFETs), in some embodiments, each of FETs $102_1$-$102_4$ can be a PFET or an NETT or FETs $102_1$-$102_4$ can be any combination of PFETs and NFETs. Further, though two of each FETs $102_1$-$102_4$ are shown in FIG. 1A, semiconductor device 100 can have any number of FETs. The discussion of elements of FETs $102_1$-$102_4$ with the same annotations applies to each other, unless mentioned otherwise. The isometric and cross-sectional views of semiconductor device 100 is shown for illustration purposes and may not be drawn to scale.

FETs $102_1$-$102_4$ can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as germanium; (ii) a compound semiconductor including silicon carbide, gallium arsenide, gallium phosphide, indium phosphide, indium arsenide, and/or indium antimonide; (iii) an ahoy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

FETs $102_4$-$102_2$ and FETs $102_3$-$102_4$ can include fin structures $108_1$-$108_2$ extending along an X-axis, epitaxial fin regions 110A-110B, gate structures $112_1$-$112_2$ and $112_3$-$112_4$ (also referred to as gate-all-around (GAA) structures $112_1$-$112_2$ and $112_3$-$112_4$), respectively, inner spacers 142 (shown in FIG. 1B), and gate pacers 114. Although FIG. 1A shows one fin structure for each FET, any number of fin structures can be included in semiconductor device 100 for each FET.

Each of fin structures $108_1$-$108_2$ can include a fin base portion 108A and a stacked fin portion 108B disposed on fin base portion 108A. In some embodiments, fin base portion 108A can include material similar to substrate 106. Fin base portion 108A can be formed from a photolithographic patterning and an etching of substrate 106. Stacked fin portion 108B can include first and second semiconductor layers 120 and 122 stacked in an alternating configuration. Each first semiconductor layer 120 can have (i) nanostructured regions 120A (shown in FIG. 1E) underlying epitaxial fin regions 110A-110B, and (ii) nanostructured regions 120B (not shown in FIGS. 1A-1E; shown in FIG. 4B) prior to being etched to form gate structures $112_1$-$112_4$, as described in further detail below. Each second semiconductor layer 122 can have (i) nanostructured regions 122A underlying epitaxial fin regions 110A-110B, and (ii) nanostructured channel regions 122B underlying gate structures $112_1$-$112_4$.

First and second semiconductor layers 120 and 122 can be epitaxially grown and can include semiconductor materials different from each other. In some embodiments, first and second semiconductor layers 120 and 122 can include semiconductor materials similar to or different from substrate 106. In some embodiments, first and second semiconductor layers 120 and 122 can include semiconductor materials with oxidation rates and/or etch selectivity different from each other. In some embodiments, each of first and second semiconductor layers 120 and 122 can include silicon germanium (SiGe) with Ge in a range from about 25 atomic percent to about 50 atomic percent with any remaining atomic percent being Si or can include Si without any substantial amount of Ge.

The semiconductor materials of first and/or second semiconductor layers 120 and 122 can be undoped or can be in-situ doped during their epitaxial growth process using: (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. First and second semiconductor layers 120 and 122 can have respective vertical dimensions 120t and 122t (e.g., thicknesses) along a Z-axis, each ranging from about 6 nm to about 10 nm. Vertical dimensions 120t and 122t can be equal to or different from each other.

In some embodiments, fin base portion 108A and stacked fin portion 108B can have respective vertical dimensions $H_1$ and $H_2$ (e.g., heights) along a Z-axis, each ranging from about 40 nm to about 60 nm. Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm. In some embodiments, fin structures $108_1$-$108_4$ can each have a horizontal dimension $L_1$ (e.g., length) along an X-axis ranging from about 100 nm to about 1 μm. Horizontal dimension $L_1$ of each fin structures $108_1$-$108_4$ can be at least 100 nm to prevent the relaxation of strain in fin structures $108_1$-$108_4$, and consequently, prevent the relaxation of strain in nanostructured channel regions 122B formed under gate structures $112_1$-$112_4$. Other dimensions and materials for fin structures $108_1$-$108_4$ are within the scope and spirit of this disclosure.

Referring to FIGS. 1A-1C, epitaxial fin regions 110A-110B can be grown on regions of stacked fin portion 108B that are not underlying gate structures $112_1$-$112_4$. Epitaxial fin regions 110A-110B can include an epitaxially-grown semiconductor material. In some embodiments, the epitaxially grown semiconductor material can be the same material as the material of substrate 106. In some embodiments, the epitaxially-grown semiconductor material can include a different material from the material of substrate 106. The epitaxially-grown semiconductor material can include: (i) a semiconductor material, such as germanium or silicon; (ii) a compound semiconductor material, such as gallium arsenide and/or aluminum gallium arsenide; or (iii) a semiconductor alloy, such as silicon germanium and/or gallium arsenide phosphide.

In some embodiments, epitaxial fin regions 110A-110B can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110A-110B can be grown by an epitaxial deposition/partial etch process, which can repeat the epitaxial deposition/partial etch process at least once. Such repeated deposition/partial etch process is also called a cyclic deposition-etch (CDE) process.

Epitaxial fin regions 110A-110B can be both p-type or n-type or one of each conductivity type epitaxial fin regions. In some embodiments, epitaxial fin regions 110A can be n-type to form NFETs $102_1$-$102_2$ and epitaxial fin regions 110B can be p-type to form PFETs $102_3$-$102_4$. P-type epitaxial fin regions 110A and/or 110B can include SiGe and can be in-situ doped during an epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used.

In some embodiments, each p-type epitaxial fin region 110A and/or 110B can have multiple sub-regions (not shown) that may include SiGe and may differ from each other based on, for example, doping concentration, epitaxial growth process conditions, and/or relative concentration of Ge with respect to Si. Each of the sub-regions can have thicknesses similar to or different from each other and thicknesses may range from about 0.5 nm to about 5 nm. In some embodiments, the atomic percent Ge in the sub-region closest to stacked fin portion 108B can be smaller than the atomic percent Ge in the sub-region farthest from stacked fin portion 108B. In some embodiments, the sub-region closest to stacked fin portion 108E can include Ge in a range from about 15 atomic percent to about 35 atomic percent, while the sub-region farthest from stacked fin portion 108B can include Ge in a range from about 25 atomic percent to about 50 atomic percent with any remaining atomic percent being Si in the sub-regions.

These multiple sub-regions of p-type epitaxial fin regions 110A and/or 110B can be epitaxially grown under a pressure of about 10 Torr to about 300 Torr and at a temperature of about 500° C. to about 700° C. using reaction gases such as hydrochloric acid (HCl) as an etching agent, GeH$_4$ as Ge precursor, dichlorosilane (DCS) and/or silane (SiH$_4$) as Si precursor, B$_2$H$_6$ as B dopant precursor, H$_2$, and/or N$_2$. To achieve different concentration of Ge in the plurality of sub-regions, the ratio of a flow rate of Ge to Si precursors is varied during their respective growth process, according to some embodiments. For example, a Ge to Si precursor flow rate ratio in a range from about 9 to about 25 can be used during the epitaxial growth of the sub-region closest to stacked fin portion 108B, while a Ge to Si precursor flow rate ratio less than about 6 can be used during the epitaxial growth of the sub-region farthest from stacked fin portion 108B.

The multiple sub-regions of p-type epitaxial fin regions 110A and/or 110B can have varying p-type dopant concentration with respect to each other, according to some embodiments. For example, the sub-region closest to stacked fin portion 108B can be undoped or may have a dopant concentration lower than the dopant concentration (e.g., dopant concentration in a range from about $1\times10^{20}$ to about $3\times10^{22}$ atoms/cm$^3$) of the sub-region farthest from stacked fin portion 108B.

In some embodiments, n-type epitaxial fin regions 110A and/or 110B can include Si and may be in-situ doped during an epitaxial growth process using n-type dopants, such as phosphorus or arsenic. For n-type in-situ doping, n-type doping precursors such as, but not limited to, phosphine (PH$_3$), arsine (AsH$_3$), and/or other n-type doping precursor can be used. Each n-type epitaxial fin region 110A and/or 110B can have a multiple n-type sub-regions. Except for the type of dopants, the multiple n-type sub-regions may be similar to the plurality of p-type sub-regions, in thickness, relative Ge concentration with respect to Si, dopant concentration, and/or epitaxial growth process conditions. Other materials, thicknesses, Ge concentrations, and dopant concentrations for the plurality of n-type and/or p-type sub-regions are within the scope and spirit of this disclosure.

Referring to FIGS. 1B-1C, epitaxial fin regions 110A-110B along with their underlying nanostructured regions 120A and 122A can form source/drain (S/D) regions 126A-126B, respectively. Each of nanostructured channel regions 122B of FETs 102$_1$-102$_2$ and FETs 102$_3$-102$_4$ can be interposed between a pair of S/D regions 126A-126B, respectively. Even though FETs 102$_1$-102$_2$ and FETs 102$_3$-102$_4$ are shown to have fin structures 108$_1$-108$_2$ with stacked tin portions 108B of alternating layers of material on fin base portions 108A, other fin structures (e.g., a single layered fin structure etched from or epitaxially grown on substrate 106) of FETs 102$_1$-102$_4$ are within the scope and spirit of this disclosure.

Referring to FIGS. 1A-1E, gate structures 112$_1$-112$_4$ can be multi-layered structures and can be wrapped around nanostructured channel regions 122B for which gate structures 112$_1$-112$_4$ can be referred to as gate-all-around (GAA) structures or horizontal gate-all-around (HGAA) structures, and FETs 102$_1$-102$_4$ can be referred to as GAA FETs 102$_1$-102$_4$. Gate structures 112$_1$-112$_4$ can have a horizontal dimension G$_L$ (e.g., gate length; shown in FIG. 1A) along an X-axis ranging from about 3 nm to about 1000 nm.

Each of gate structures 112$_1$-112$_4$ associated can include an oxide layer 112A and a gate dielectric layer 112B disposed on oxide layer 112A, and gate structures 112$_1$-112$_4$ can include gate electrode 112C$_1$-112C$_4$, respectively, disposed on their dielectric layers 112B. As shown in cross-sectional views of FETs 102$_1$ and 102$_4$ in respective FIGS. 1D-1E, oxide layers 112A and gate dielectric layers 112B can be wrapped around nanostructured channel regions 122B to fill the spaces between adjacent nanostructured channel regions 122B, and thus, electrically isolate nanostructured channel regions 122B from each other and from conductive gate electrodes 112C$_1$ and 112C$_4$ to prevent shorting between gate electrodes 112C$_1$ and S/D regions 126A and gate electrodes 112C$_4$ and S/D regions 126B during operation of FETs 102$_1$ and 102$_4$. FET 102$_2$-102$_3$ can have cross-sectional views along respective lines E-E and F-F of FIG. 1A similar to the cross-sectional view of FET 102$_1$ in FIG. 1D. Gate structures 112$_1$-112$_4$ can have materials and/or electrical properties (e.g., threshold voltages, work function values) different from each other. For example, each FETs 102$_1$-102$_4$ can have different oxide layers 112A, different gate dielectric layers 112B, and/or different gate electrodes 112C$_1$-112C$_4$. For example, oxide layers 112A of each FETs 102$_1$-102$_4$ can have different material or thickness from each other. Similarly, gate dielectric layers 112B of each FETs 102$_1$-102$_4$ can have different material or thickness from each other, gate electrodes 112C$_1$-112C$_4$ of each FETs 102$_1$-102$_4$ can have different material or thickness from each other. Also, though gate structures 112$_1$-112$_4$ are shown to have horizontal GAA structures, other gate structures (e.g., vertical GAA structures, gate structures without GAA structures, gate structures encapsulating top/sides of nanostructured channel region 122B to form finFETs 102$_1$-102$_4$) are within the scope and spirit of this disclosure.

Each oxide layer 112A can be an interfacial dielectric layer sandwiched between each nanostructured channel region 122B and gate dielectric layer 112B. In some embodiments, each oxide layer 112A can include a semiconductor oxide material (e.g., silicon oxide or silicon germanium oxide) and can have a thickness ranging from about 1 nm to about 10 nm.

Each gate dielectric layer 112B can have a thickness ranging from about 1 nm to about 5 nm. Each gate dielectric layer 112B can include silicon oxide and can be formed by CVD, atomic layer deposition (ALD), physical vapor deposition (PVD), e-beam evaporation, or other suitable processes. In some embodiments, each gate dielectric layer 112B can include (i) a layer of silicon oxide, silicon nitride, and/or silicon oxynitride, (ii) a high-k dielectric material, such as hafnium oxide (HfO$_2$), titanium oxide (TiO$_2$) hafnium zirconium oxide (HfZrO), tantalum oxide (Ta$_2$O$_3$), hafnium silicate (HfSiO$_4$), zirconium oxide (ZrO$_2$), zirconium silicate (ZrSiO$_2$), (iii) a high-k dielectric material having oxides of lithium (Li), beryllium (Be), magnesium (Mg), calcium (Ca), strontium (Sr), scandium (Se), yttrium (Y), zirconium (Zr), aluminum (Al), lanthanum (La), cerium (Ce), praseodymium (Pr), neodymium (d), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, each gate dielectric layer 112B can include a single layer or a stack of insulating material layers. Other materials and formation methods for gate dielectric layers 112B are within the scope and spirit of this disclosure.

Each of gate electrodes $112C_1$-$112C_4$ can include a gate work function layer 130 and a gate metal fill layer 132. As shown in cross-sectional views of FETs $102_1$ and $102_4$ in respective FIGS. 1D-1E, each nanostructured channel region 122B can be wrapped around by gate work function layers 130. Depending on the spaces between adjacent nanostructured channel regions 122B and the thicknesses of the layers of gate electrodes $112C_1$-$112C_4$, each nanostructured channel region 122E can be wrapped around by one or more layers of gate electrodes $112C_1$-$112C_4$ filling the spaces between adjacent nanostructured channel regions 122B. Though FIGS. 1D-1E show gate metal fill layers 132 partially wrapped around nanostructured channel regions 122B, gate metal fill layers 132 can also wrap around nanostructured channel regions 122B to fill the spaces between adjacent nanostructured channel regions 122B (not shown), according to some embodiments.

Each gate work function layer 130 can include a single metal layer or a stack of metal layers. The stack of metal layers can include metals having work function values equal to or different from each other. In some embodiments, each gate work function layer 130 can include aluminum (Al), copper (Cu), tungsten (W), titanium (Ti), tantalum (Ta), titanium nitride (TiN), tantalum nitride (TaN), nickel silicide (NiSi), cobalt de (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. Each gate work function layer 130 can be formed using a suitable process such as ALD, CVD, PVD, plating, or combinations thereof. In some embodiments, each gate work function layer 130 can have a thickness ranging from about 2 nm to about 15 nm. Other materials, formation methods and thicknesses for gate work function layers 130 are within the scope and spirit of this disclosure.

Each gate metal fill layer 132 can include a single metal layer or a stack of metal layers. The stack of metal layers can include metals different from each other, in some embodiments, each gate metal fill layer 132 can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, anchor combinations thereof. Gate metal fill layers 132 can be formed by ALD, PVD, CVD, or other suitable deposition processes. Other materials and formation methods for gate metal fill layers 132 are within the scope and spirit of this disclosure.

In some embodiments, as shown in FIGS. 1B-1D, gate electrodes $112C_1$-$112C_3$ can further include gate barrier layers $128_1$-$128_3$ sandwiched between nanostructured channel region 122B and gate work function layers 130. Gate barrier layers 128 can be configured to selectively tune the work function values of each of gate electrodes $112C_1$-$112C_3$ to provide specific threshold voltages to each of gate electrodes $112C_1$-$112C_3$. Additionally or optionally, gate work function layers 130 can be similarly configured to selectively tune the work function values of each of gate electrodes $112C_1$-$112C_3$. As such, each of gate electrodes $112C_1$-$112C_3$ can be selectively configured to have same or different work function values from each, thus, allowing FETs $102_1$-$102_3$ to have same or different threshold voltages from each other because threshold voltages are dependent on work function values of gate electrodes $112C_1$-$112C_3$. In some embodiments, gate electrodes can be formed without a gate barrier layer, such as gate electrode $112C_4$ shown in FIGS. 1A, 1C, and 1E. Forming FETs, such as FETs $102_1$-$102_4$ with and without gate barrier layers, such as gate barrier layers $128_1$-$128_3$ on the same substrate (e.g., substrate 106) can be a method of forming FETs of different conductivity types with different work function values, and as a result, with different and/or low threshold voltages on the same substrate. Such method can be less complicated and more cost-effective in manufacturing reliable gate structures in FETs with nanostructured channel regions and with different and/or low threshold voltages than other methods of forming FETs with similar channel dimensions and threshold voltages on the same substrate.

In some embodiments, gate barrier layers $128_1$-$128_3$ can serve as nucleation layers for subsequent formation of gate work function layers 130, and/or can prevent substantial diffusion of metals (e.g., Al) to underlying layers (e.g., gate dielectric layers 112B or oxide layers 112A). Each of gate barrier layer $128_1$-$128_3$ can include titanium (Ti), tantalum (Ta), titanium nitride (TiN), tantalum nitride (TaN), or other suitable diffusion barrier materials and can be formed by ALD, PVD, CVD, or other suitable metal deposition processes. In some embodiments, gate barrier layers $128_1$-$128_3$ can include substantially fluorine-free metal or metal-containing film and can be formed by ALD or CVD using one or more non-fluorine based precursors. The substantially fluorine-free metal or fluorine-free metal-containing film can include an amount of fluorine contaminants less than 5 atomic percent in the form of ions, atoms, and/or molecules. In some embodiments, each of gate barrier layers $128_1$-$128_3$ can have a thickness ranging from about 1 nm to about 10 nm. Other materials, formation methods and thicknesses for gate barrier layers $128_1$-$128_3$ are within the scope and spirit of this disclosure.

The threshold voltages of FETs $102_1$-$102_4$ can depend on the work function value of the respective gate barrier layers $128_1$-$128_3$ and the work function value of the respective gate work function layers 130. As such, the threshold voltages of FETs $102_1$-$102_4$ can be adjusted by adjusting the work function value of the respective gate barrier layer $128_1$-$128_3$ and/or the work function value of the respective gate work function layers 130. The work function values of gate barrier layers $128_1$-$128_3$ or of gate work function layers 130 can be adjusted by respectively controlling the doping configuration (e.g., dopant type, dopant concentration, and/or doping profile) of gate barrier layers $128_1$-$128_3$ and/or of gate work function layers 130. For example, different concentrations of n-type and/or p-type dopants or different materials of dopants in gate barrier layers $128_1$-$128_3$ and/or gate work function layers 130 can result in different work function values of gate barrier layer $128_1$-$128_3$ and/or of gate work function layer 130. The dopants (e.g., Al) in gate barrier layers $128_1$-$128_3$ and/or gate function layers 130 can have work function values different from the work function values of the material layers (e.g., TaN layer, TiN layer, etc.) of gate barrier layers $128_1$-$128_3$ and/or gate work function layers 130. As such, the work function values of gate barrier layer $128_1$-$128_3$ and/or gate function layer 130 can be a value between the work function values of the dopants (e.g., Al) and the material layers (e.g., TaN layer, TiN layer) of gate barrier layer $128_1$-$128_3$ and/or of gate work function layers 130. Thus, the work function values of the materials of gate barrier layers $128_1$-$128_3$ and/or gate work function layers 130 can be shifted to a specific value based on the doping configuration of gate barrier layers $128_1$-$128_3$ and/or of gate work function layers 130, and consequently, adjust the threshold voltages of FETs $102_1$-$102_4$ to specific values for improved and faster device performance.

For example, gate work function layer 130 can include a TiN layer doped with Al. Since Al has a smaller work function value than TiN, the work function value of Al-doped TiN layer of gate work function layer 130 can be shifted to a lower value than the undoped TiN layer. Similarly, gate barrier layers $128_1$-$128_3$ can include a TaN layer doped with Al. Since Al has a smaller work function value than TaN, the work function value of Al-doped TaN layer of gate barrier layers $128_1$-$128_3$ can be shifted to a lower value than the undoped TaN layer. By selectively controlling the concentration of Al in the TaN layer and/or the TiN layer, gate barrier layers $128_1$-$128_3$ and/or gate work function layers 130 can be configured to have different work function values from each other, respectively, and as a result, FETs $102_3$-$102_4$ can have threshold voltages different from each other. In some embodiment FETs $102_1$-$102_2$ can be NFETs and FETs $102_3$-$102_4$ can be PFETs, where the Al doping concentration of FET $102_1$-$102_2$'s gate work function layer 130 and/or gate barrier layer $128_1$-$128_2$ can be higher than that of FET $102_3$-$102_4$'s gate work function layer 130 and/or FET $102_3$'s gate barrier layer $128_3$. As such, the work function value (e.g., about 4.4 eV) of gate electrode $112C_1$ can be lower than the work function value (e.g., about 4.5 eV) of gate electrode $112C_2$, which can be lower than the work function value (e.g., about 4.7 eV) of gate electrode $112C_3$, which can be lower than the work function value (e.g., about 4.8 eV) of gate electrode $112C_4$, and as a result, the threshold voltage of FET $102_1$ can be lower than the threshold voltage of FET$102_2$ and the threshold voltage of FET $102_4$ can be lower than the threshold voltage of FET$102_3$. In some embodiment FETs $102_1$-$102_2$ can be NFETs, where the Al doping concentration of FET $102_1$'s gate work function layer 130 and/or gate barrier layer $128_1$ can be higher than that of FET $102_2$'s gate work function layer 130 and/or gate barrier layer $128_2$, and as a result, the threshold voltages of FET $102_1$ can be lower than FET $102_2$. In some embodiments, gate work function layers 130 and/or gate barrier layers $128_1$-$128_3$ can be doped by a dopant material, such as fluorine (F), chlorine (Cl), tungsten (W), cobalt (Co), any suitable metal, an organic material, or a combination thereof to adjust the threshold voltages of FETs, such as FETs $102_1$-$102_4$, in semiconductor device 100. Other materials and formation methods for the dopant material, gate work function layer 130 or gate barrier layers $128_1$-$128_3$ are within the scope and spirit of this disclosure.

Referring to FIGS. 1A-1C, gate spacers 114 and inner spacers 142 can form sidewalls of gate structures $112_4$-$112_4$. Each gate spacer 114 and inner spacer 142 can be in physical contact with oxide layers 112A and gate dielectric layers 112B, according to some embodiments. Each of gate spacers 114 and inner spacer 142 can include insulating material, such as silicon oxide, silicon nitride, a low-k material, or a combination thereof. Each gate spacer 114 and inner spacer 142 can have a low-k material with a dielectric constant less than about 3.9. In some embodiments, each gate spacer 114 and inner spacer 142 can have a thickness ranging from about 2 nm to about 10 nm. Other materials and thicknesses for gate spacers 114 and inner spacers 142 are within the scope and spirit of this disclosure.

In some embodiments, referring to FIG. 1A, semiconductor device 100 can further include isolation structure 104. Isolation structure 104 can be positioned between fin structures $108_1$-$108_2$. Isolation structure 104 can electrically insulate first and second semiconductor layers 120 and 122 of fin structures $108_1$ from those of fin structures $108_2$. Further, isolation structure 104 can be configured to electrically isolate gate structures $112_1$-$112_2$ from gate structures $112_3$-$112_4$. In some embodiments, isolation structure 104 can have horizontal (e.g., width in the y-direction) substantially equal to that of fin structures $108_1$-$108_2$. In some embodiments, isolation structure 104 can include an insulating material, such as silicon oxide or silicon germanium oxide.

Referring to FIGS. 1A-1C, semiconductor device 100 can further include etch stop layer (ESL) 116, interlayer dielectric (ILD) layer 118, and shallow trench isolation (STI) regions 138. ESL 116 can be configured to protect gate structures $112_1$-$112_4$, isolation structure 104, and/or epitaxial fin regions 110A-110B. This protection can be provided, for example, during formation of ILD layer 118 and/or S/D contact structures (not shown). ESL 116 can be disposed on sidewalls of gate spacers 114 and isolation structure 104. In some embodiments, ESL 116 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof in some embodiments, ESL 116 can include silicon nitride or silicon oxide formed by low pressure chemical vapor deposition (LPCVD), plasma enhanced chemical vapor deposition (PECVD), chemical vapor deposition (CND), or silicon oxide formed by a high-aspect-ratio process (HARP). In some embodiments, ESL 116 can have a thickness ranging from about 3 nm to about 30 nm. Other materials, formation methods, and thicknesses for ESL 116 are within the scope and spirit of this disclosure.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can be silicon oxide. In some embodiments, ILD layer 118 can have a thickness in a range from about 50 nm to about 200 nm. Other materials, thicknesses, and formation methods for ILD layer 118 are within the scope and spirit of this disclosure.

STI regions 138 can be configured to provide electrical isolation between fin structure $108_1$-$108_2$. Namely, STI regions 138 can be configured to provide electrical isolation between transistors, such as FETs $102_1$-$102_4$, resided on different tin structures $108_1$-$108_2$ on substrate 106 and/or neighboring active and passive elements (not shown) integrated with or deposited on substrate 106. In some embodiments, STI regions 138 can include a plurality of layers, such as a nitride layer, an oxide layer disposed on the nitride layer, and an insulating layer disposed on the nitride layer. In some embodiments, the insulating layer can include silicon oxide, silicon nitride, silicon oxynitride, fluorine-doped silicate glass (FSG), a low-k dielectric material, and/or other suitable insulating materials. In some embodiments, STI regions 138 can have a vertical dimension $138_H$ (e.g., height) along a Z-axis ranging from about 40 nm to about 60 nm. In some embodiments, vertical dimension $138_H$ can be half of the total height $H_T$ of fin structures $108_1$-$108_2$.

The cross-sectional shapes of semiconductor device 100 and its elements (e.g., fin structure $108_1$-$108_2$, gate structures 112₁-112₄, epitaxial fin regions 110A-110B, isolation structure 104, gate spacers 114, and/or STI regions 138) are illustrative and are not intended to be limiting.

Figure 2:
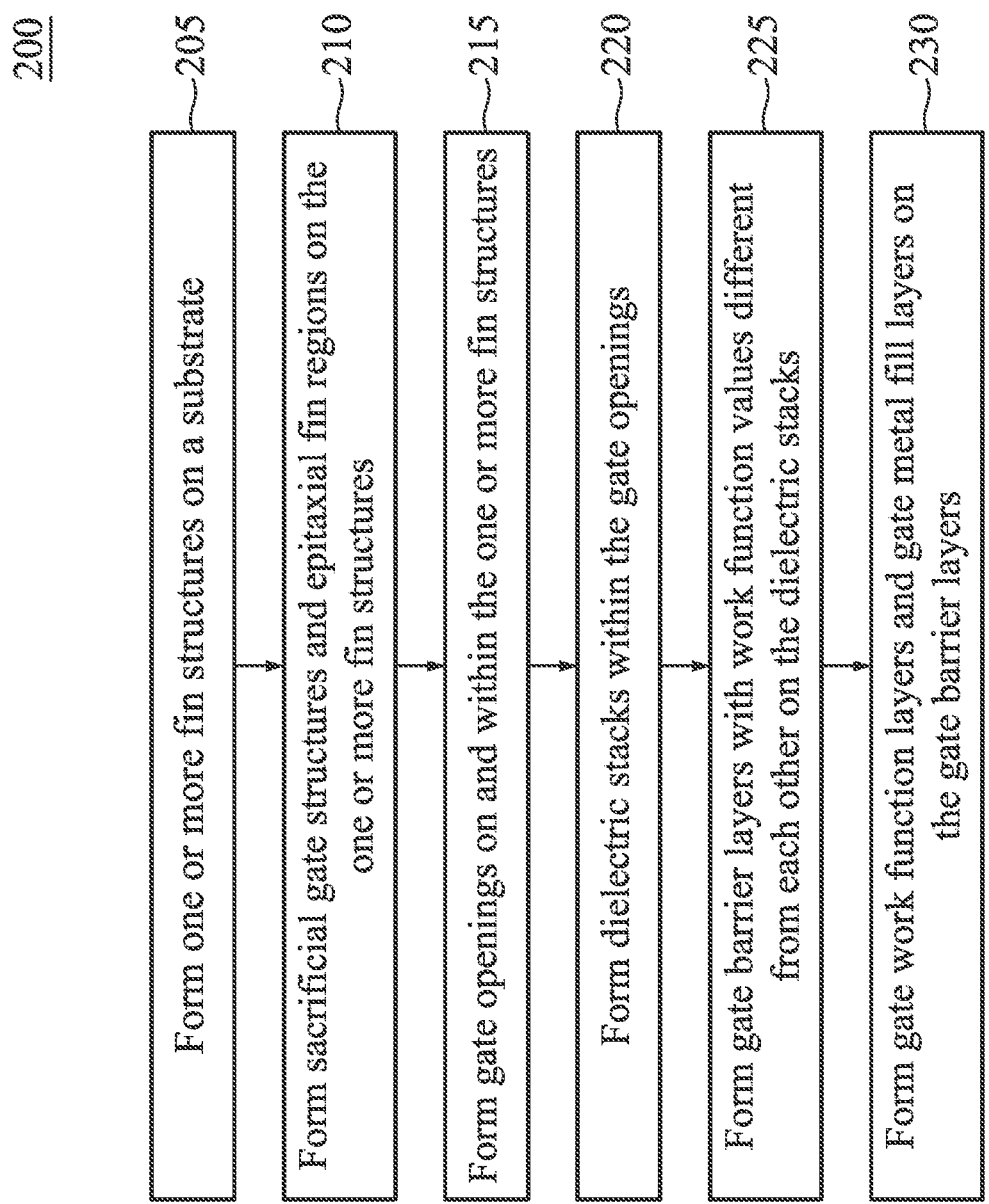
FIG. 2 is a flow diagram of a method for fabricating a semiconductor device, according to some embodiments.
Figure 3C:
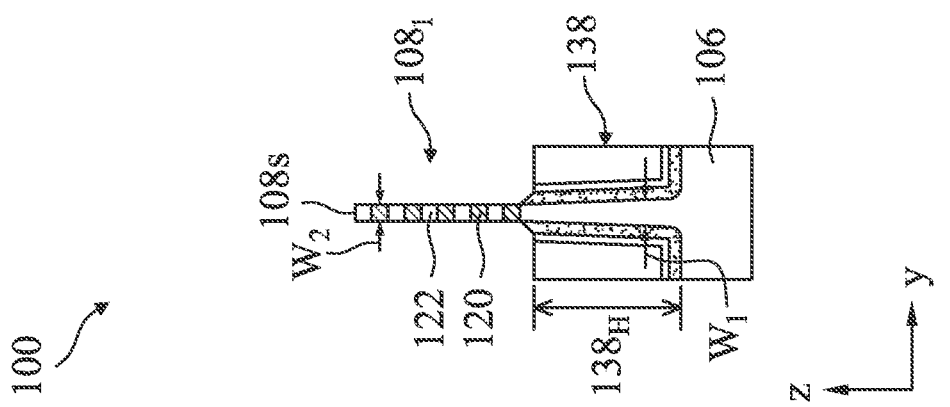
Figures 4A, 4B:
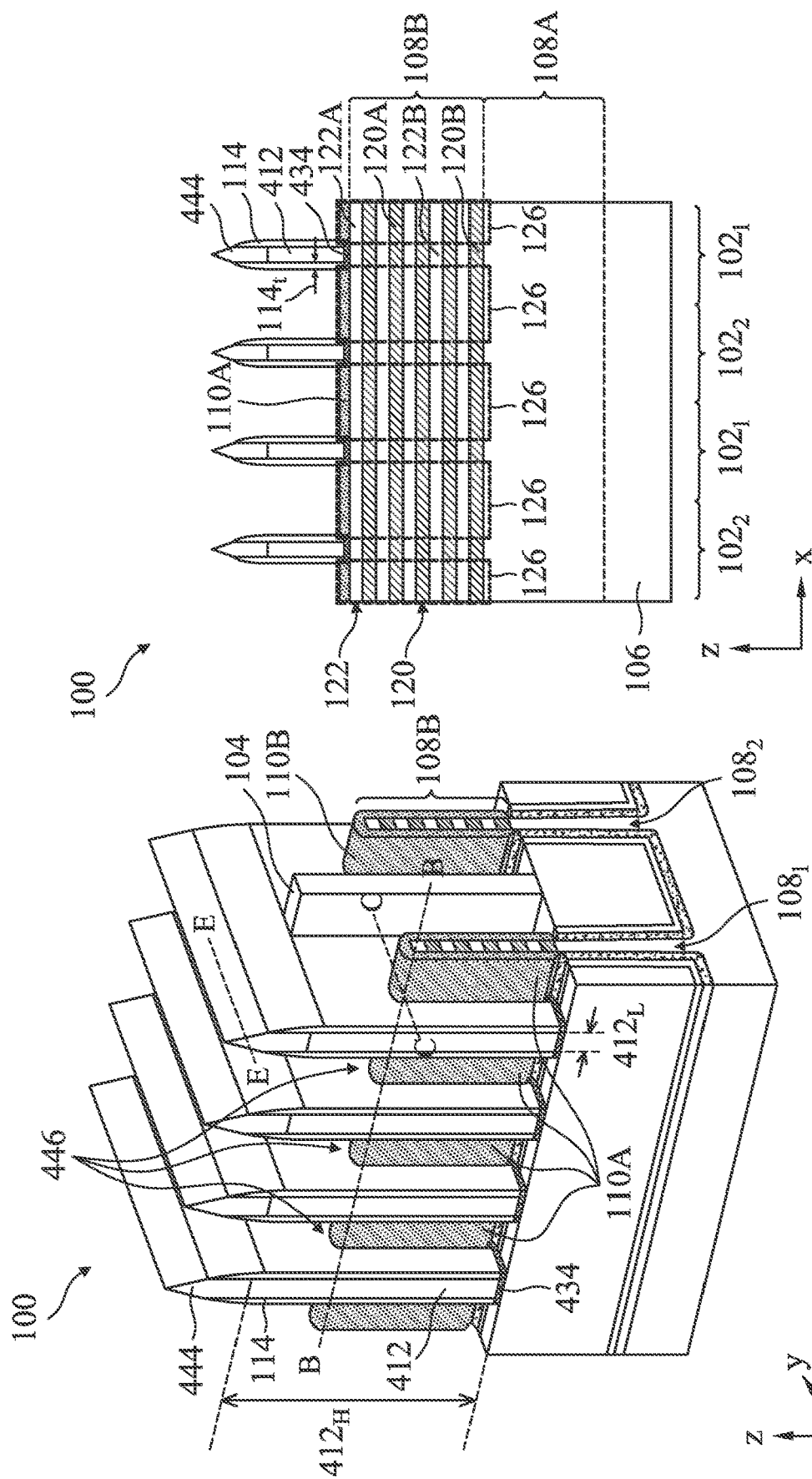
Figure 5A:
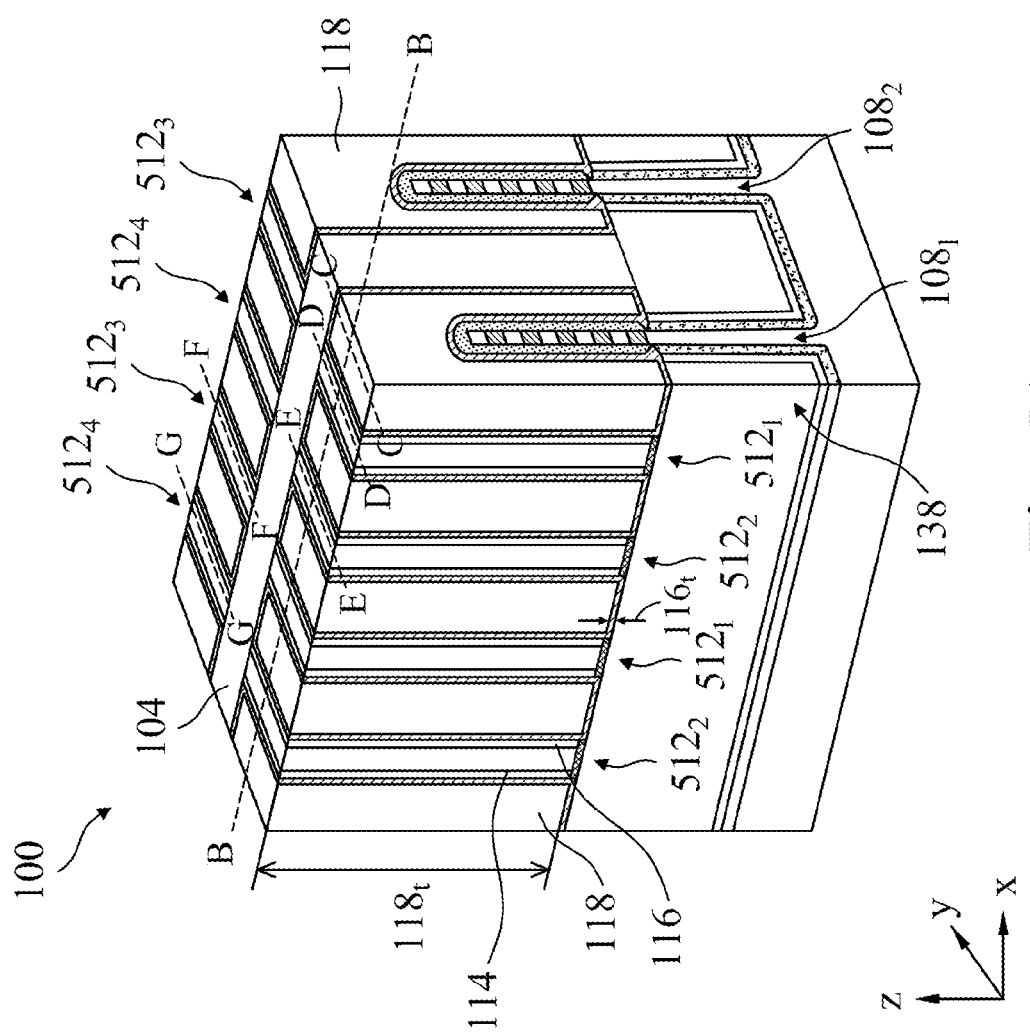

FIG. 2 is a flow diagram of an example method 200 for fabricating semiconductor device 100, according to some embodiments. For illustrative purposes, the operations illustrated in FIG. 2 will be described with reference to the example fabrication process for fabricating semiconductor device 100 as illustrated in FIGS. 3A-15A, 3B-15B, 3C-15C, 4D-15D, 17A-17D, 18A-18B, and 4E. FIGS. 3A-6A are isometric views of semiconductor device 100 at various stages of its fabrication, according to some embodiments. FIGS. 3B-6B and 3C-6C are cross-sectional views along lines B-B and C-C of FIGS. 3A-6A, respectively, according to some embodiments. FIG. 4E is a cross-sectional view along line E-E of FIG. 4A and FIGS. 5D-6D are cross-sectional views along lines D-D of FIGS. 5A-6A, respectively, according to some embodiments. The cross-sectional views along fin structure 108₂ of partially fabricated semiconductor device 100 of FIGS. 4A-5A can be similar to the cross-sectional views of FIGS. 4B-5B, respectively. FIGS. 5D and 6D can also represent cross-sectional views along lines F-F and G-G of respective FIGS. 5A-6A. FIGS. 7A-15D, and FIGS. 17A-17D are cross-sectional views of areas $102_{1A}$-$102_{2A}$ and $102_{3A}$-$102_{4A}$ of FIGS. 6B-6C at various stages of its fabrication to respectively form areas $102_{1A}$-$102_{2A}$ and $102_{3A}$-$102_{4A}$ of FIGS. 1B-1C, respectively, according to some embodiments. FIGS. 18A-18B are cross-sectional views along lines B-B and C-C of semiconductor device 100 after method 200, according to some embodiments. Operations can be performed in a different order or not performed depending on specific applications. It should be noted that method 200 may not produce a complete semiconductor device 100. Accordingly, it is understood that additional processes can be provided before, during, and after method 200, and that some other processes may only be briefly described herein. Further, the discussion of elements in FIGS. 1A-1E, 3A-15A, 3B-15B, 3C-15C, 4D-15D, 17A-17D, 18A-18B, and 4E with the same annotations applies to each other, unless mentioned otherwise.

In operation 205, one or more fin structures are formed on a substrate. For example, fin structures 108₁-108₂ with fin base portions 108A and stacked fin portions 108B can be formed on substrate 106 as described with reference to FIGS. 3A-3C. The formation of fin structures 108₁-108₂ can include the formation of a stacked layer (not shown) with alternating layers of materials of respective first and second semiconductor layers 120 and 122 on substrate 106 and the etching of the stacked layer and/or substrate 106 through a patterned hard mask layer (not shown) formed on the stacked layer. In some embodiments, the hard mask layer can be a thin film including silicon oxide formed, for example, using a thermal oxidation process. In some embodiments, the hard mask layer can be formed of silicon nitride using, for example, low pressure chemical vapor deposition (LPCVD) or plasma enhanced CND (PECVD). The etching of the stacked layer and/or substrate 106 can include a dry etch, a wet etch process, or a combination thereof. The dry etch process can include using etchants having an oxygen-containing gas, a fluorine-containing, gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable etching gases and/or plasmas, or combinations thereof. The wet etch process can include etching in diluted hydrofluoric acid (DHF), potassium hydroxide (KOH) solution, ammonia, a solution containing hydrofluoric acid (HF), nitric acid ($HNO_3$), acetic acid ($CH_3COOH$), or combinations thereof.

Each of the layers of materials of first and second semiconductor layers 120 and 122 in the stacked layer can be epitaxially grown on its underlying layer and can include semiconductor materials different from each other. In some embodiments, each of first and second semiconductor layers 120 and 122 can be epitaxially grown using a CVD process, a MBE process, or a ALD process, in some embodiments, first and second semiconductor layers 120 and 122 can include semiconductor materials with oxidation rates and/or etch selectivity different from each other. In some embodiments, first and second semiconductor layers 120 and 122 can include materials similar to or different from substrate 106. In some embodiments, each of first and second semiconductor layers 120 and 122 can include silicon germanium (SiGe) with Ge in a range from about 25 atomic percent to about 50 atomic percent with any remaining atomic percent being Si or can include Si without any substantial amount of Ge.

First and/or second semiconductor layers 120 and 122 can be undoped or can be in-situ doped during their epitaxial growth process using (i) p-type dopants, such as boron, indium, or gallium; and/or (ii) n-type dopants, such as phosphorus or arsenic. For p-type doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used. First and second semiconductor layers 120 and 122 can each have a thickness, along a Z-axis, from about 6 nm to about 10 nm. In some embodiments, first and second semiconductor layers 120 and 122 can be grown with different doping type over different locations of substrate 106. For example, first and second semiconductor layers 120 and 122 can be doped with a p-type dopant at or near the location of fin structure 108₁ and can be doped with an n-type dopant at or near the location of fin structure 108₂.

Figure 3B:
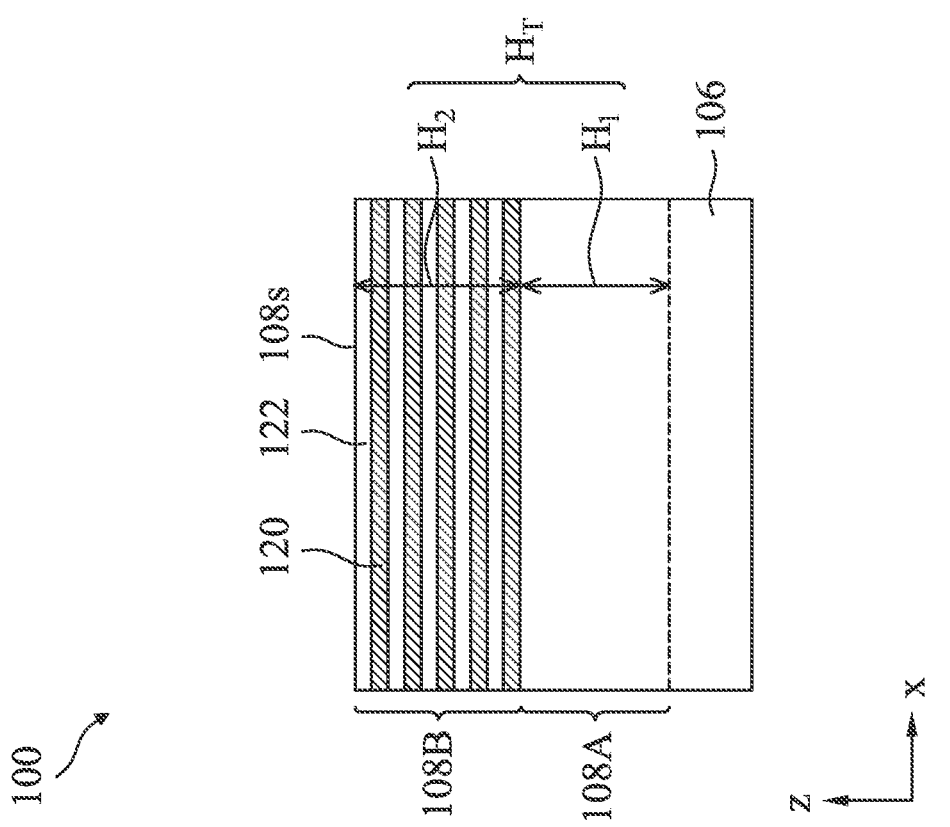

In some embodiments, as shown in FIG. 3B, fin base portions 108A and stacked fin portions 108B can respectively have vertical dimensions $H_1$ and $H_2$ (e.g., heights) along a Z-axis, each ranging from about 40 nm to about 60 nm. Vertical dimensions $H_1$ and $H_2$ can be equal to or different from each other and can have values such that the sum of $H_1$ and $H_2$ (i.e., total height $H_T$ of fin structure 108) ranges from about 80 nm to about 120 nm. In some embodiments, each of fin structures 108₁-108₂ can have a tapered cross-section along a YZ-plane with a horizontal dimension $W_1$ (e.g., width) of fin base portions 108B along a Y-axis being greater than a horizontal dimension $W_2$ of stacked fin portions 108B along a Y-axis. In some embodiments, horizontal dimension $W_1$ and $W_2$ can range from about 6 nm to about 50 nm.

Further, in operation 205, STI regions can be formed on the substrate. For example, as shown in FIG. 3C, STI regions 138 can be formed on substrate 106. The formation of SYI regions 138 can include (i) depositing a layer of nitride material (not shown) on each of fin structures 108₁-108₂, (ii) depositing a layer of oxide material (not shown) on the layer of nitride material, (iii) depositing a layer of insulating material on the layer of oxide maternal, (iv) annealing the layer of insulating material, (v) chemical mechanical polishing (CMP) the layers of nitride and oxide materials and the annealed layer of insulating material, and (vi) etching back the polished structure to form STI regions 138 of FIG. 3A.

The layers of nitride and oxide materials can be deposited using a suitable process for depositing oxide and nitride materials, such as ALD or CVD. These layers of oxide and nitride materials can prevent oxidation of the sidewalls of stacked fin portion 108B during the deposition and annealing of the insulating material. In some embodiments, the layer of insulating material can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane ($SiH_4$) and oxygen ($O_2$) as reacting precursors. In some embodiments, layer of insulating material can be formed using a sub-atmospheric CVD (SACVD) process or high aspect-ratio process (HARP), where process gases can include tetraethoxysilane (TEOS) and/or ozone ($O_3$).

In some embodiments, the layer of insulating material can be formed by depositing flowable silicon oxide using a flowable CVD (FCVD) process. The FCVD process can be followed by a wet anneal process. The wet anneal process can include annealing the deposited layer of insulating material in steam at a temperature in a range from about 200° C. to about 700° C. for a period in a range from about 30 min to about 120 min. The wet anneal process can be followed by the CMP process to remove portions of the layers of nitride, oxide, and insulating materials to substantially coplanarize top surfaces of the layers of nitride, oxide, and insulating materials with top surface 108s of each of fin structures $108_1$-$108_2$. The CMP process can be followed by the etching process to etch back the layers of nitride, oxide, and insulating materials to form STI regions 138 of FIG. 3A.

The etch back of the layers of nitride, oxide, and insulating materials can be performed by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the dry etch process can each range from about 10 sccm to about 100 sccm. In some embodiments, the wet etch process can be performed at a pressure ranging from about 5 mTorr to about 100 and a high temperature ranging from about 50° C. to about 120° C.

In some embodiments, referring to FIG. 3A, isolation structures 104 can be formed between fin structures $108_1$-$108_2$. A process for forming fin isolation structure 104 can include (i) depositing an insulating material, such as a low-k dielectric, on each of fin structures $108_1$-$108_2$ and substrate 106, (ii) forming a hard mask stack (not shown) to define locations of isolation structures 104, and (iii) etching the insulating material using the hard mask stack. In some embodiments, as shown in FIG. 3A, isolation structure 104 can be formed on STI region 138 and between two adjacent fin structures $108_1$-$108_2$. Other processes for forming fin isolation structure 104 are within the scope and spirit of this disclosure.

Referring to FIG. 2, in operation 210, sacrificial gate structures and epitaxial fin regions are formed on the one or more fin structures. For example, sacrificial gate structures $512_1$-$512_4$ and epitaxial fin regions 110A-110B associated with FETs $102_1$-$102_4$, respectively, can be formed on fin structures $108_1$-$108_2$ as described with reference to FIGS. 4A-5D.

As shown in FIGS. 4A-4D, the process of forming gate structures $512_1$-$512_4$ can include forming a protective oxide layer 434 on fin structures $108_1$-$108_2$ and STI regions 138, and forming polysilicon structures 412 on protective oxide layer 434. The formation of protective oxide layer 434 can include blanket depositing a layer of oxide material (not shown) on the structure of FIG. 3A followed by removing portions of the layer of oxide material via an etching process, such as a wet etch process using diluted HF, using polysilicon structures 412 (formed at later fabrication steps) as hard masks. The layer of oxide material can include a suitable oxide material, such as silicon oxide and can be blanket deposited using a suitable deposition process, such as CVD, ALD, plasma enhanced ALD (PEALD), physical vapor deposition (PVD), or e-beam evaporation. In some embodiments, the layer of oxide material can be deposited using PFALD at an energy ranging from about 400 W to about 500 W and at a temperature ranging from about 300° C. to about 500° C. The deposition of the layer of oxide material can be followed by a dry anneal process under oxygen gas flow at a temperature ranging from about 800° C. to about 1050° C. The oxygen precursor concentration can be in a range of about 0.5% to about 5% of the total gas flow rate. In some embodiments, the anneal process can be a flash process where the anneal time can be between about 0.5 s to about 5 s.

In some embodiments, referring to FIG. 4E, protective oxide layer 434 can have a vertical dimension $434_t$ along a Z-axis and a horizontal dimension $434_s$ (e.g., thickness on sidewalk of stacked fin portion 108B) along a Y-axis each ranging from about 1 nm to about 3 nm. In some embodiments, dimension $434_t$ can be equal to or greater than dimension $434_s$. Other oxide materials, formation methods, and thicknesses for protective oxide layer 434 are within the scope and spirit of this disclosure. The presence of protective oxide layer 434 can allow etching polysilicon from high aspect ratio spaces 446 (e.g., aspect ratio greater than 1:15) shown in FIG. 4A between adjacent polysilicon structures 412 without substantially etching and/or damaging fin structures $108_1$-$108_2$ during the formation of polysilicon structures 412.

The formation of the layer of oxide material can be followed by the formation of polysilicon structures 412 on portions of the layer of oxide material. The formation of polysilicon structures 412 can include blanket depositing a layer of polysilicon material on the layer of oxide material and etching the layer of polysilicon material through a patterned hard mask layer 444 (shown in FIGS. 4A-4B and 4E) formed on the layer of polysilicon material. In some embodiments, polysilicon material can be undoped and hard mask layer 444 can include an oxide layer and/or a nitride layer. The oxide layer can be formed using a thermal oxidation process and the nitride layer can be formed by LPCVD or PECVD. Hard mask layer 444 can protect polysilicon structures 412 from subsequent processing steps (e.g., during formation of gate spacers 114, epitaxial fin regions 110A-110B, ILD layer 118, and/or ESL 116).

The blanket deposition of the layer of polysilicon material can include CVD, PVD, ALD, or other suitable deposition processes. In some embodiments, etching of the deposited layer of polysilicon material can include a dry etch, a wet etching, or a combination thereof. In some embodiments, etching of the deposited layer of polysilicon material to form polysilicon structures 412 can include four etching steps. The first polysilicon etch step can include using a gas mixture having hydrogen bromide (HBr), oxygen ($O_2$), fluoroform ($CHF_3$), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. The first polysilicon etch step can have a higher polysilicon etch rate than the second, third, and/or fourth polysilicon etch steps. The first polysilicon etch step is used to etch unwanted portions of the blanket deposited layer of polysilicon material above fin structures $108_1$-$108_2$. The second, third, and fourth polysilicon etch steps are used to etch unwanted portions of the blanket deposited layer of polysilicon material within high aspect ratio spaces 446.

In some embodiments, vertical dimensions $412_H$ of polysilicon structures 412 along a Z-axis can be in a range from about 100 nm to about 150 nm. In some embodiments, horizontal dimensions $412_L$ of polysilicon structures 412 along an X-axis can be in a range from about 3 nm to about 50 nm. Polysilicon structures 412 can have a high aspect ratio equal to or greater than about 9, where aspect ratio is a ratio of dimension $412_H$ to dimension $412_L$. In some embodiments, horizontal dimensions along an X-axis (e.g., spacing) between adjacent polysilicon structures 412 can be in a range from about 40 nm to about 90 nm. The sum of a value of the horizontal dimension and a value of dimension $412_L$ is referred to as "one contacted poly pitch (1CPP)." in some embodiments, horizontal dimension $L_1$ (shown in FIG. 1A) of fin structures $108_1$-$108_2$ along an X-axis can be at least 3CPP to prevent the relaxation of strain in fin structures $108_1$-$108_2$, and consequently, prevent the relaxation of strain in channel regions formed in nanostructured channel regions 122B under gate structures $112_1$-$112_4$ as discussed above.

Further, in operation 210, gate spacers can be formed on sidewalls of the polysilicon structures. For example, as shown in FIGS. 4A-4B, gate spacers 114 can be formed on sidewalls of polysilicon structures 412. The formation of gate spacers 114 can include blanket depositing a layer of an insulating material, such as an oxide and a nitride material, on polysilicon structures 412 by a CVD, a PVD, or an ALD process followed by an etching process. By way of example and not limitation, the etching process can include an reactive ion etching process or other dry etching process using a chlorine or fluorine based etchant. Gate spacers 114 can each have a horizontal dimension $114_t$ (e.g., thickness) along an X-axis ranging from about 6 nm to about 8 nm, according to some embodiments.

Epitaxial fin regions 110A-110B can be formed on surfaces of stacked fin portions 108B of fin structures $108_1$-$108_2$ not covered by polysilicon structures 412 and gate spacers 114. In some embodiments, epitaxial fin regions 110A-110B can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110A-110B can be grown by an epitaxial deposition/partial etch process, which repeats the epitaxial deposition/partial etch process at least once. In some embodiments, epitaxial fin regions 110A-110B can be grown by selective epitaxial growth (SEG), where an etching gas is added to promote the selective growth of semiconductor material on the exposed surfaces of stacked fin portions 108B, but not on insulating material (e.g., insulating material of STI regions 138 and/or of gate spacers 114).

In some embodiments, epitaxial fin regions 110A-110B can be p-type or n-type. In some embodiments, p-type epitaxial fin regions 110A and/or 110B can include SiGe and can be in-situ doped during the epitaxial growth process using p-type dopants, such as boron, indium, or gallium. For p-type in-situ doping, p-type doping precursors such as, but not limited to, diborane ($B_2H_6$), boron trifluoride ($BF_3$), and/or other p-type doping precursors can be used. In some embodiments, n-type epitaxial fin regions 110A and/or 110B can include Si without any substantial amount of Ge and can be in-situ doped during the epitaxial growth process using n-type dopants, such as phosphorus or arsenic. For n-type in-situ doping, n-type doping precursors such as, but not limited to, phosphine ($PH_3$), arsine ($AsH_3$), and/or other n-type doping precursor can be used.

In some embodiments, as shown in FIG. 4C, epitaxial fin regions 110A-110B can each have a thickness $110t_1$ along sidewalls of stacked fin portion 108B and a thickness $110t_2$ on top surface of stacked fin portion 108B. In some embodiments, thicknesses $110t_1$ and $110t_2$ can be equal to or different from each other. In some embodiments, each of thicknesses $110t_1$ and $110t_2$ can range from about 3 nm to about 6 nm.

In some embodiments, instead of epitaxial fin regions 110A-110B and underlying nanostructured regions 120A and 122A forming S/D regions 126A-126B, diamond-shaped epitaxial fin regions 110A-110B as shown in FIG. 4D can form S/D regions of FETs $102_1$-$102_4$. The diamond-shaped epitaxial fin regions 110A-110B can be formed after the formation of gate spacers 114 followed by etch back of the portions of stacked fin portions 108B not covered by polysilicon structures 412 and gate spacers 114. In some embodiments, a biased etching process can be performed to etch back these portions of stacked fin portions 108B. The etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the etching process, polysilicon structures 412 can be protected from being etched by hard mask layer 444 and gate spacers 114.

Further, in operation 210, an etch stop layer (ESL) can be formed on the epitaxial fin regions and an interlayer dielectric (ILD) layer can be formed on the ESL. For example, as shown in FIGS. 5A 5C, ESL 116 can be disposed on epitaxial fin regions 110A-110B, gate spacers 114, and STI regions 138, and ILD layers 118 can be disposed on ESL 116. In some embodiments, ESL 116 can be formed of materials including $SiN_x$, $SiO_x$, SiON, SiC, SiCN, BN, SiBN, SiCBN, or a combination thereof. The formation of ESL 116 can include blanket depositing a layer of material for ESL 116 on the structure of FIG. 4A using PECVD, sub atmospheric chemical vapor deposition (SACVD), LPCVD, ALD, high-density plasma (HDP), plasma enhanced atomic layer deposition (PEALD), molecular layer deposition (MLD), plasma impulse chemical vapor deposition (PICVD), or other suitable deposition methods. In some embodiments, referring to FIG. 5B, ESL 116 can have a thickness $116_t$ on epitaxial fin regions 110, gate spacers 114, and STI regions 138 ranging from about 3 nm to about 30 nm.

The blanket deposition of the layer of material for ESL 116 can be followed by a blanket deposition of a layer of dielectric material for ILD layer 118. In some embodiments, the dielectric material can be silicon oxide. The layer of dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using FCVD process. The blanket deposition process can be followed by a thermal annealing of the deposited layer of dielectric material in steam at a temperature ranging from about 200° C. to about 700° C. for a period ranging from about 30 minutes to about 120 minutes. In some embodiments, referring to FIG. 5A, ILD layer 118 can have a thickness $118_t$ ranging from about 50 nm to about 200 nm.

The thermal annealing can be followed by a CMP process to coplanarize top surfaces of ESL 116, ILD layer 118, gate spacers 114, isolation structure 104, and polysilicon structures 412 with each other as shown in FIGS. 5A-5D. During the CMP process, hard mask layer 444 can be removed. Following the CMP process, sacrificial gate structures $512_1$-$512_4$, can be formed on fin structures $108_1$-$108_2$.

Referring to FIG. 2, in operation 215, gate openings are formed on and within the one or more fin structures. For example, gate openings $612_1$-$612_4$ associated with FETs $102_1$-$102_4$, respectively, can be formed to on and within fin structures $108_1$-$108_2$ as described with reference to FIGS. 6A-6D. The formation of gate openings $612_1$-$612_4$ can include the formation of cavities $655_1$-$655_4$ on fin structures $108_1$-$108_2$ and cavities $656_1$-$656_4$ within fin structures $108_1$-$108_2$, The formation of cavities $655_1$-$655_4$ can include removing polysilicon structures 412 using a dry etching process (e.g., reaction ion etching) or a wet etching process. In some embodiments, the gas etchants used in the dry etching process can include chlorine, fluorine, bromine, or a combination thereof. In some embodiments, an ammonium hydroxide (NH4OH), sodium hydroxide (NaOH), and/or potassium hydroxide (KOH) wet etch can be used to remove polysilicon structures 412, or a dry etch followed by a wet etch process can be used to remove polysilicon structures 412. After removing polysilicon structures 412, protective oxide layer 434 underlying polysilicon structures 412 can be exposed. The formation of cavities $655_1$-$655_4$ can further include removing the exposed protective oxide layer 434 using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof.

Figures 6A, 6B:
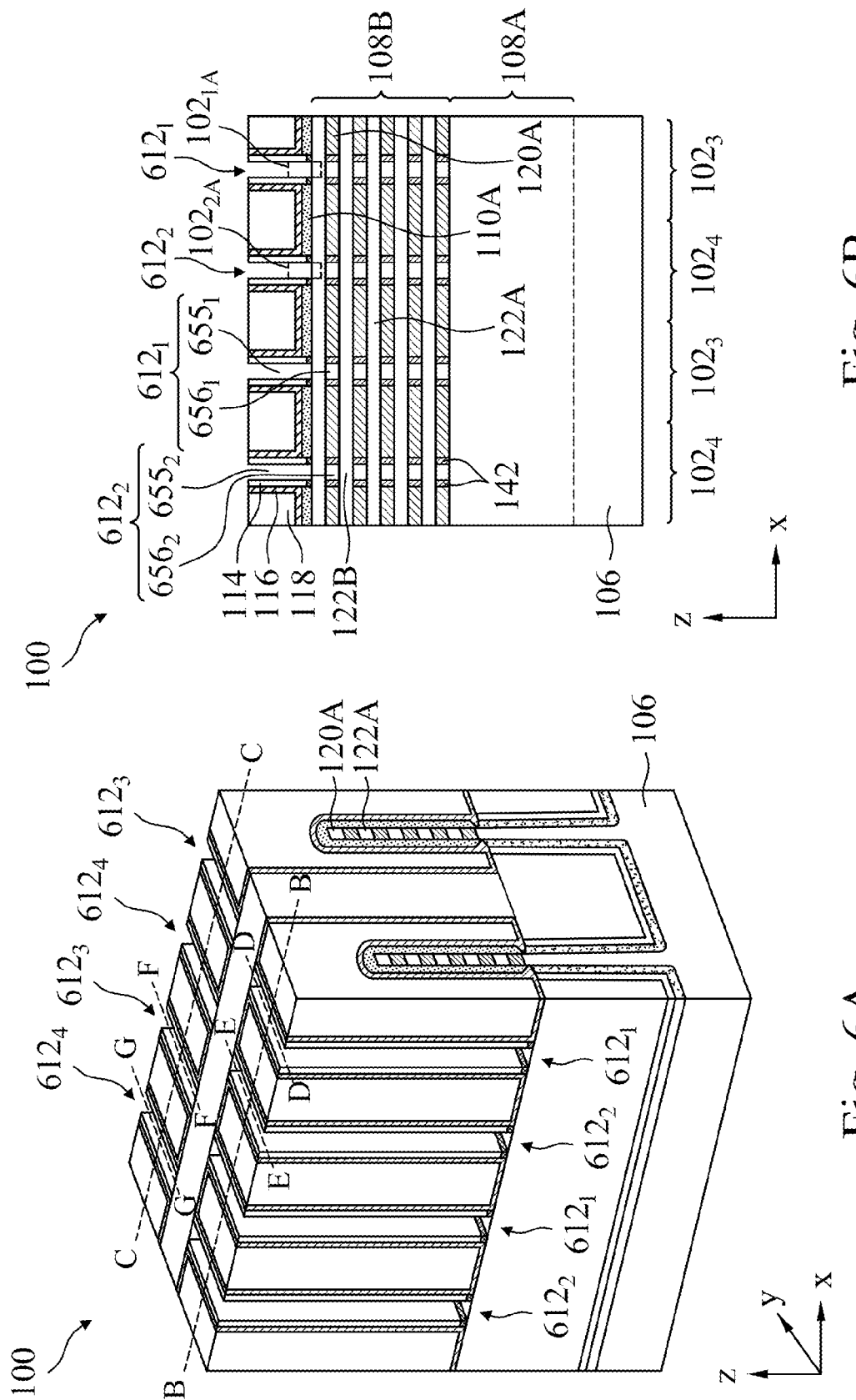
Figure 6C:
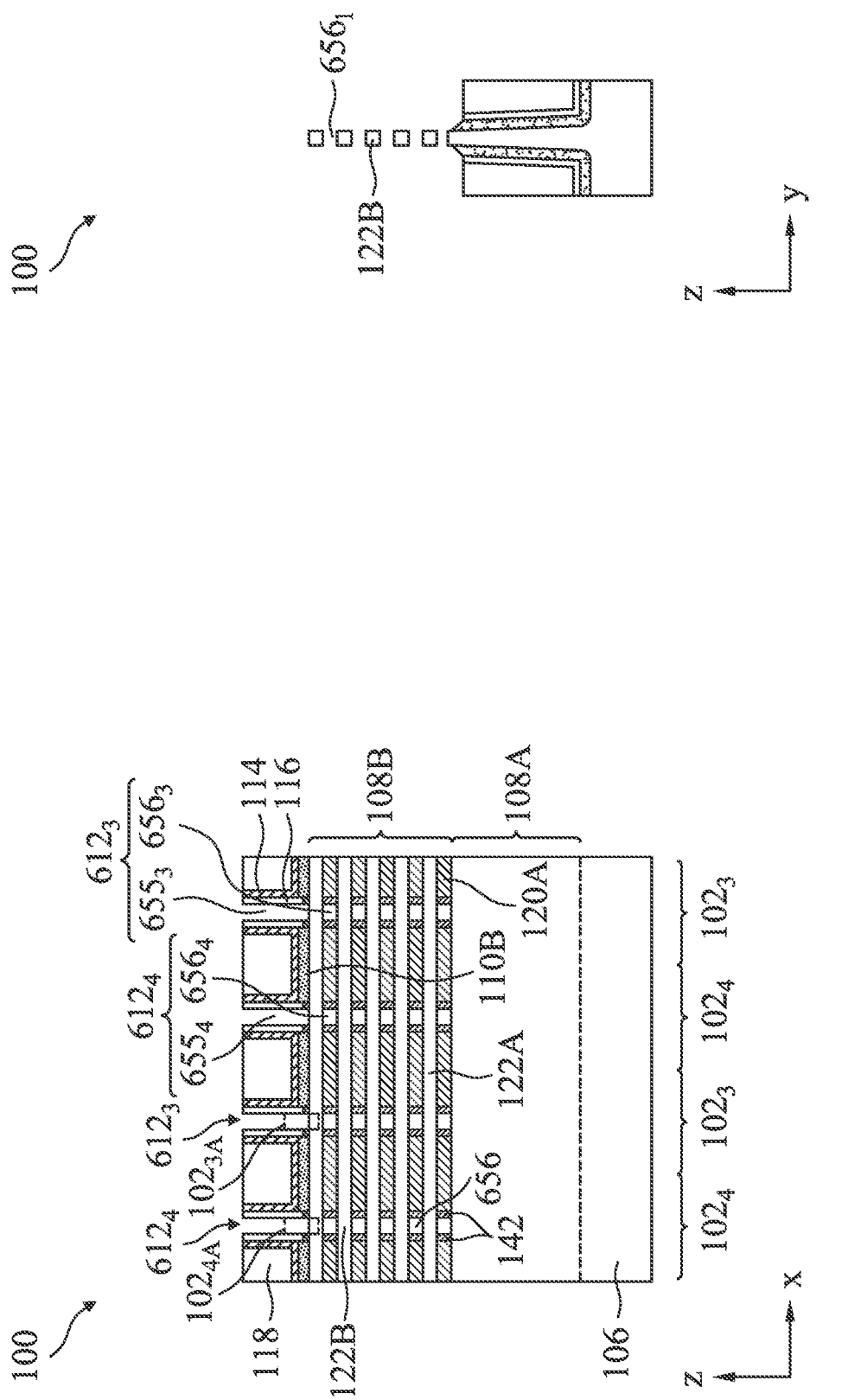
Figure 6D:
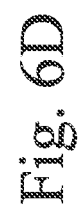
Figure 9B:
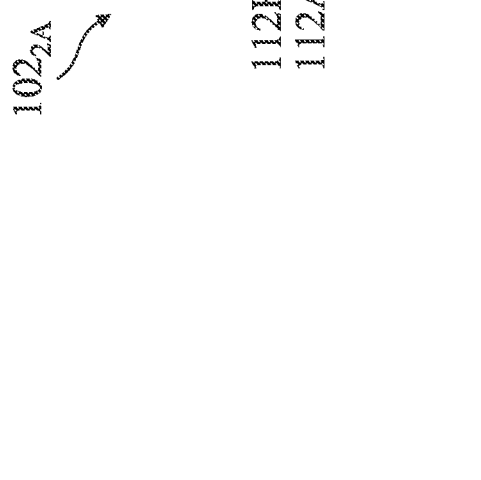
Figure 9D:
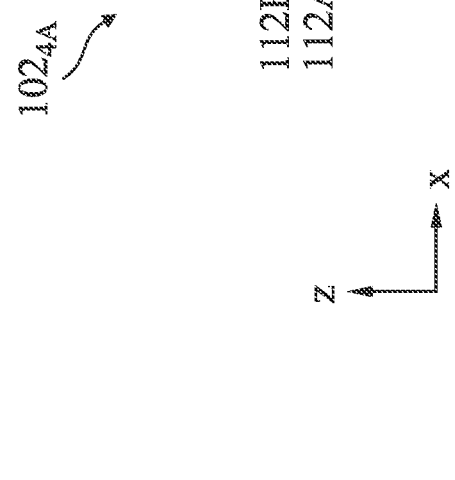
Figure 9A:
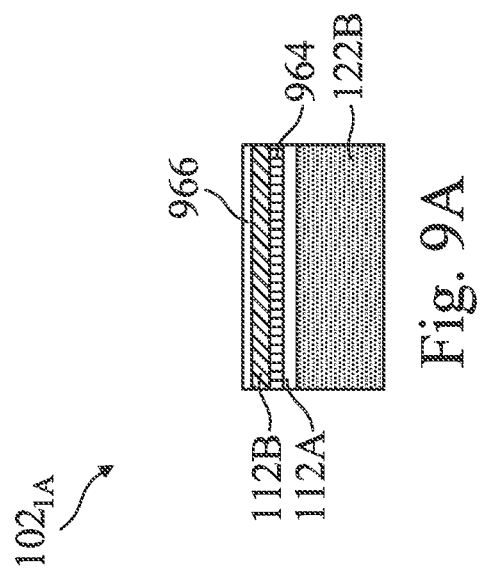
Figure 9C:
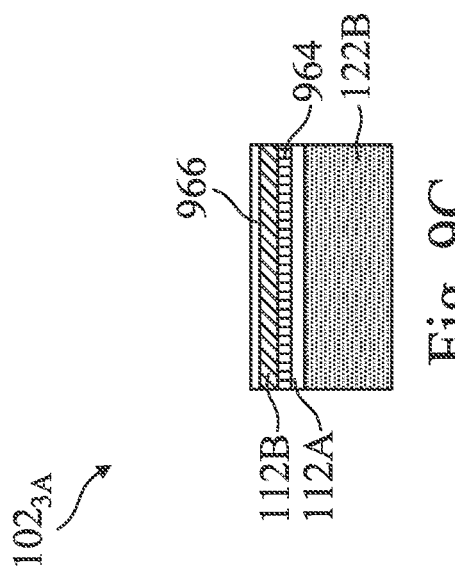
Figure 14A:
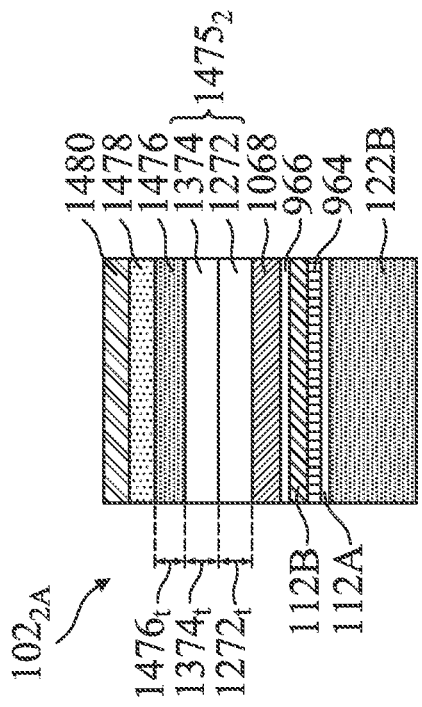
Figure 14B:
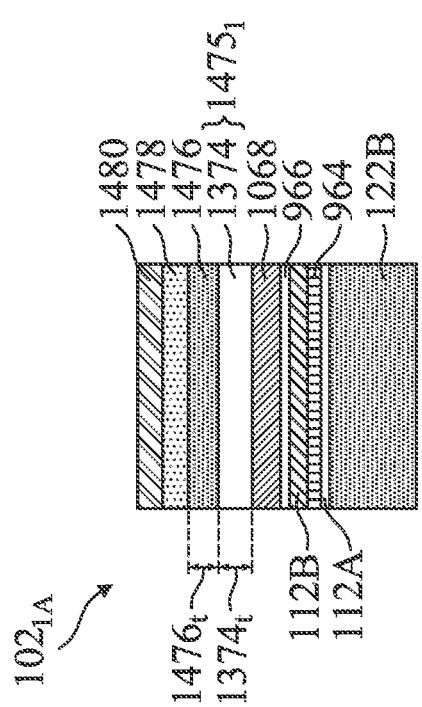
Figure 14C:
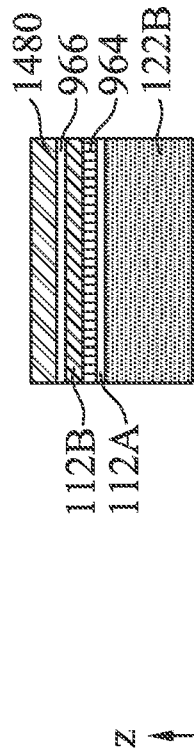
Figure 14D:
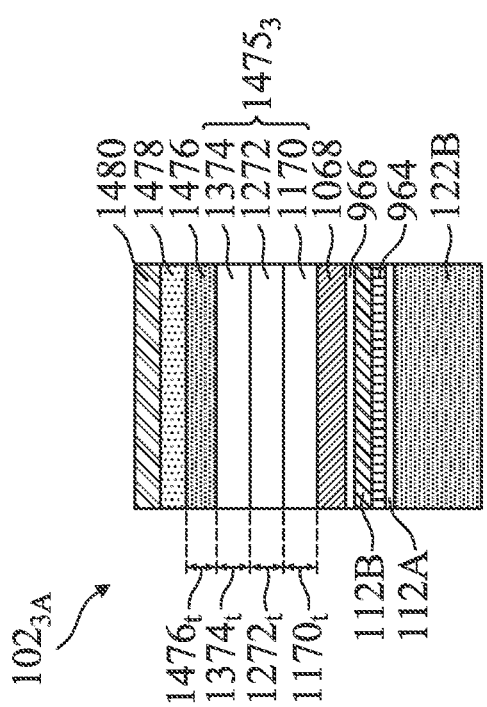
Figure 15A:
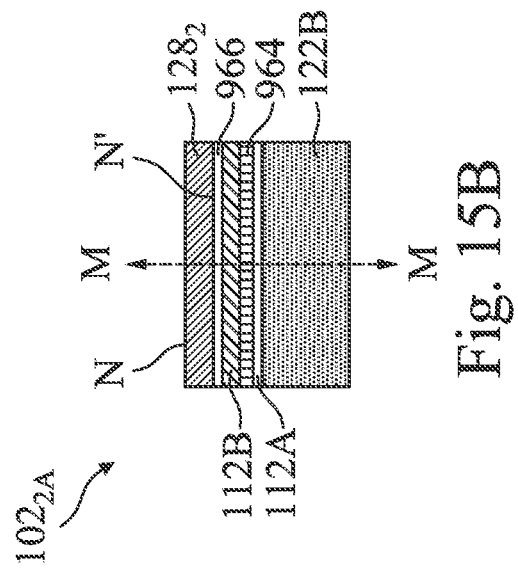
Figure 15C:
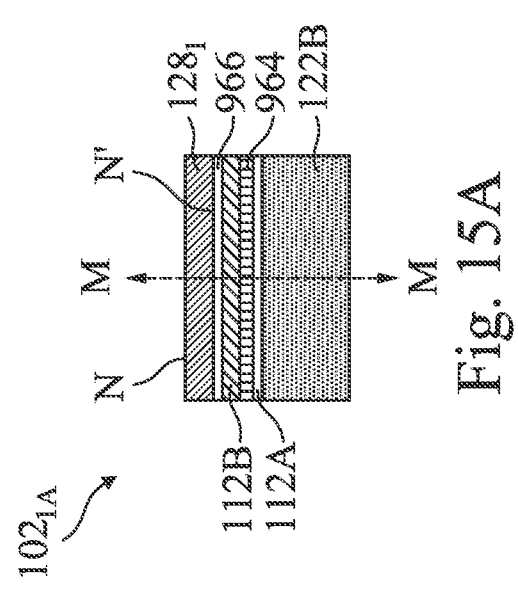
Figure 15B:
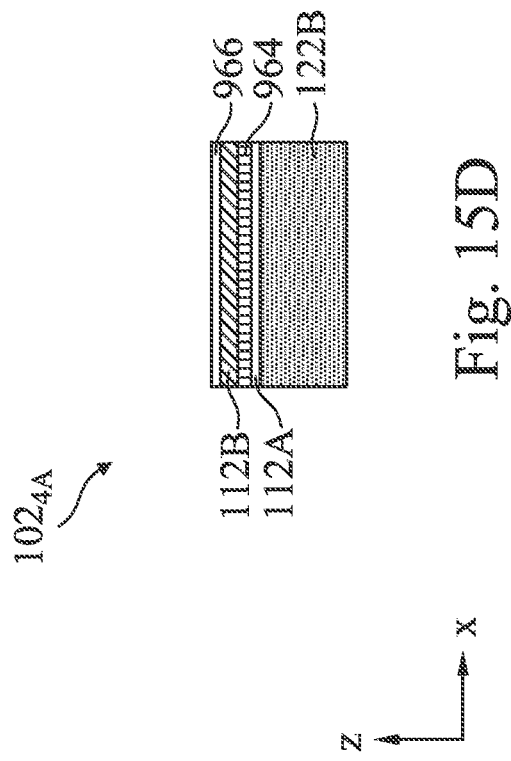
Figure 15D:
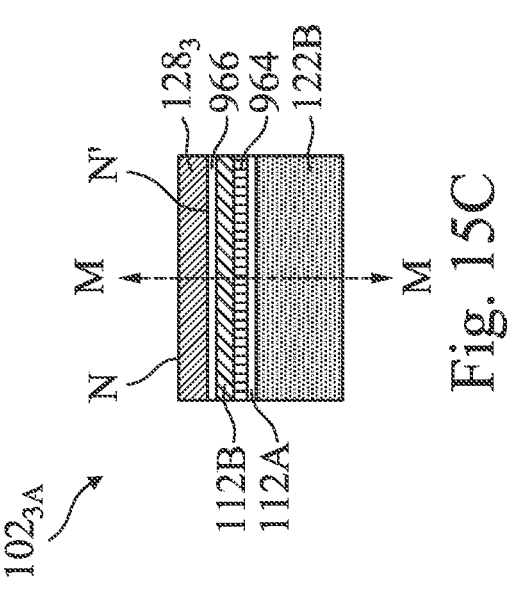

Referring to FIGS. 6B-6D, the formation of cavities $656_1$-$656_4$ can include selectively removing nanostructured regions 120B (shown in FIG. 4B) of semiconductor layers 120 to form cavities $656_1$-$656_4$ between nanostructured channel regions 122B. Nanostructures regions 120B can be removed using a selective etching process that has a higher etching rate towards semiconductor layers 120 and a lower etching rate towards semiconductor layers 122. In some embodiments, the selective etching process can be a wet etching process or a dry etching process using HCl gas. Further, a pair of inner spacers 142 can be formed at both ends of each cavity $656_1$-$656_4$ along an X-axis. By way of example and not limitation, the formation of inner spacers 142 can include etching back nanostructured regions 120A adjacent to each cavity $656_1$-$656_4$ followed by blanket depositing a layer of insulating material, such as an oxide and a nitride material, and an etching process to remove the deposited layer of insulating material outside the etched back nanostructured regions 120A. In some embodiments, the etching back of nanostructured regions 120A can be performed via a selective etching process that etches nanostructured regions 120A from nanostructured channel regions 122B. In some embodiments, the selective etching process can include a dry etching process using halogen-based gases or a wet etching process using mixture of sulfuric acid ($H_2SO_4$) and hydrogen peroxide ($H_2O_2$) (SPM), or a mixture of ammonia hydroxide with $H_2O_2$ and water (APM). In some embodiments, inner spacers 142 can each have a substantially identical horizontal dimension (e.g., thickness) as that of gate spacer 114 (e.g., $114_t$) along an X-axis, such as about 6 nm to about 8 nm, according to some embodiments. Gate openings $612_1$-$612_4$ can be subsequently filled with one or more layers of gate structures $112_1$-$112_4$ (shown in FIGS. 1B-1E) formed in subsequent processes described below with reference to FIGS. 7A-16D, which are cross-sectional views of areas $102_{1A}$-$102_{2A}$ and $102_{3A}$-$102_{4A}$ of FIGS. 6B-6C, respectively, at various stages of its fabrication to form areas $102_{1A}$-$102_{2A}$ and $102_{3A}$-$102_{4A}$ of FIGS. 1B-1C, respectively, according to some embodiments. The layers shown in FIGS. 7A-16D can represent the layers formed within respective gate openings $612_1$-$612_4$ of FIGS. 6B-6C during operations 230-235 described below.

Referring to FIG. 2, in operation 220, dielectric stacks are formed within the gate openings. For example, as shown and described with reference to FIGS. 7A-9D and 1B-1C, dielectric stacks having oxide layers 112A, gate dielectric layers 112B, interfacial oxide layers 964, and oxide capping layers 966 can be formed on each nanostructured channel regions 122B of FETs $102_1$-$102_4$ and within gate openings $612_1$-$612_4$.

Referring to FIGS. 7A-7D, oxide layers 112A can be formed on surfaces of nanostructured channel regions 122B between gate spacers 114 within gate openings $612_1$-$612_4$ (shown in FIGS. 6B-6C). In some embodiments, oxide layer 112A can be formed by exposing nanostructured channel regions 122E to an oxidizing ambient. By way of example and not limitation, the oxidizing ambient can include a combination of ozone (O3), a mixture of ammonia hydroxide, hydrogen peroxide, and water (SC1 solution), and/or a mixture of hydrochloric acid, hydrogen peroxide, water (SC2 solution). As a result of the aforementioned oxidation process, a $SiO_2$ layer between about 5 Å and about 15 Å can be formed on the surfaces of nanostructured channel regions 122B.

The formation of gate dielectric layers 112B can include blanket depositing a dielectric material for gate dielectric layers 112B on the structure of FIG. 6A after the formation of oxide layers 112A within gate openings $612_1$-$612_4$. The blanket deposited dielectric material can form substantially conformal gate dielectric layers 112B on oxide layers 112A (shown in FIGS. 7A-7D) and on the sidewalls of cavities $655_1$-$655_4$ (shown in FIG. 6B). In some embodiments, gate dielectric layer 112B can include a dielectric material with a dielectric constant (k-value) higher than about 3.9. By way of example and not limitation, the dielectric material for gate dielectric layers 112B can include silicon oxide and can be formed by CVD, atomic layer deposition (ALD), physical vapor deposition (PVD), e-beam evaporation, or other suitable processes. In some embodiments, the layer of dielectric material for gate dielectric layers 112B can include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Flo, Er, Tm, Yb, or Lu, or (iv) a combination thereof. High-k dielectric layers can be formed by ALD and/or other suitable methods. In some embodiments, the layer of dielectric material for gate dielectric layers 112B can have a thickness between about 10 Å and about 20 Å.

Following the formation of oxide layers 112A and gate dielectric layers 112B, a plurality of sacrificial capping layer depositions and spike annealing processes can be performed to improve the electrical characteristics of oxide layers 112A and gate dielectric layers 112B. In some embodiments, referring to FIGS. 8A-8D, a sacrificial capping layer 860 can be blanket deposited on gate dielectric layers 112B. Sacrificial capping layer 860 can include titanium or silicon and can have a thickness ranging from about 5 Å to 20 Å. In some embodiments, sacrificial capping layer 860 can include titanium-silicon-nitride (TiSiN) and can be deposited by an ALD process using titanium tetrachloride ($TiCl_4$ or $TiCl_5$), silane ($SiH_4$), and ammonia ($NH_3$). Sacrificial capping layer 860 can help to form interfacial oxide layers 964 and oxide capping layers 966 (shown in FIGS. 9A-9D) in subsequent process to reduce leakage current and improve thermal stability of gate dielectric layers 112B.

Sacrificial capping layer 862 can be subsequently blanket deposited on sacrificial capping layer 860 without breaking vacuum between the formation of sacrificial capping layers 860 and 862. Sacrificial capping layer 862 can be an oxygen diffusion barrier layer configured to prevent additional growth of oxide on oxide layers 112A during the annealing processes in subsequent fabrication steps. Sacrificial capping layer 862 can include silicon or its compound or can include an amorphous silicon layer, a polycrystalline silicon layer, or a silicon nitride layer. Second sacrificial capping layer 862 can be formed by an ALD process, a CVD process, a PVD process, or a combination thereof. In some embodiments, the formation of sacrificial capping layer 862 with a thickness of about 10 Å can include blanket depositing a silicon-based layer by a $SiH_4$ soaking process, where the surfaces of sacrificial capping layer 860 can be exposed to a $SiH_4$ gas at a temperature ranging from about 400° C. to about 450° C. for a time period ranging from about 180 seconds to about 400 seconds.

Following the formation of sacrificial capping layer 862, a first spike annealing process can be performed on the partially fabricated semiconductor device 100 in a nitrogen ambient at an annealing temperature ranging from about 850° C. to about 950° C. for a time period ranging from about 1 second to about 10 seconds. According to some embodiments, the first spike annealing can strengthen the chemical bonds at the interfaces between oxide layers 112A and gate dielectric layers 112B to improve the reliability of oxide layers 112A and/or gate dielectric layers 112B, and consequently, improve the reliability of gate structures $112_1$-$112_4$.

In some embodiments, for further improvement of the reliability of oxide layers 112A and/or gate dielectric layers 112B, a second spike annealing process can be performed following the first spike annealing process at a temperature higher than the annealing temperature of the first spike annealing process. The second spike annealing process can be performed on the partially fabricated semiconductor device 100 in a nitrogen ambient at an annealing temperature ranging from about 900° C. to about 950° C. for a time period ranging from about 1 second to about 10 seconds. Prior to performing the second spike annealing process, an additional sacrificial capping layer, such as sacrificial capping layer 863 (shown in FIGS. 8A-8D) can be blanket deposited on sacrificial capping layer 862 to prevent oxygen diffusion into oxide on oxide layers 112A during the second spike annealing process. Sacrificial capping layer 863 can be deposited after breaking vacuum between the formation of sacrificial capping layers 862 and 863. Thus, the formation of sacrificial capping layers 862 and 863 can be an in-situ and an ex-situ deposition process, respectively. Sacrificial capping layer 863 can be formed with a thickness (e.g., about 20 Å to about 30 Å) about 2 to about 5 times greater than the thickness of sacrificial capping layer 862 by an ALD process, a CVD process, a PVD process, or a combination thereof. In some embodiments, the formation of sacrificial layer 863 can include depositing a silicon-based layer by a CVD process using $SiH_4$, disaline ($Si_2H_6$), and hydrogen at a temperature ranging from about 350° C. to about 450° C.

During the first and/or second spike annealing processes, interfacial oxide layers 964 (shown in FIGS. 9A-9D) can be formed from reaction between materials of gate dielectric layers 112B and oxide layers 112A and oxide capping layers 966 (shown in FIGS. 9A-9D) can be formed on gate dielectric layers 112B from reaction between materials of gate dielectric layers 112B and sacrificial capping layer 860. In some embodiments, interfacial oxide layers 964 can include hafnium silicate ($HfSiO_x$) with a thickness ranging from about 1 Å to about 3 Å and oxide capping layers 966 can include hafnium titanium silicate ($HfTiSiO_x$) with a thickness ranging from about 1 Å to about 3 Å. Oxide capping layers 966 can act as a dopant diffusion barrier during subsequent fabrication stages. In some embodiments, the steps of the second spike annealing process and the formation of sacrificial capping layer 863 can be optional.

Referring to FIGS. 9A-9D, following the first and second spike annealing processes, sacrificial capping layers 860, 862, and 863 can be removed by a wet etching process. In some embodiments, the wet etching process can include etching in DHF, KOH solution, SC1 solution, or a combinations thereof. After removing sacrificial capping layers 860, 862, and 863, a third spike annealing process can be performed in an $NH_3$ ambient at an annealing temperature ranging from about 850° C. to about 950° C. The third spiking annealing process can incorporate nitrogen into gate dielectric layers 112B and further improve the reliability of gate structures $112_1$-$112_4$ (shown in FIG. 1A).

Referring to FIG. 2, in operation 225, gate barrier layers with work function values different from each other are formed on the dielectric stacks. For example, as shown and described with reference to FIGS. 15A-15D, gate barrier layers $128_1$-$128_3$ can be formed on gate dielectric layers 112B within gate openings $612_1$-$612_3$, where each of gate barrier layers $128_1$-$128_3$ can have different work function values from each other. The work function values of each of gate barrier layers $128_1$-$128_3$ can be selectively adjusted to a specific work function value different from each other by doping each of gate barrier layers $128_1$-$128_3$ with a dopant concentration different from each other. The doping of gate barrier layers $128_1$-$128_3$ can be performed simultaneously from the same dopant source layer (e.g., dopant source layer 1478 shown in FIGS. 14A-14C) deposited on each of gate barrier layers $128_1$-$128_3$. The simultaneous doping of each of gate barrier layers $128_1$-$128_3$ with a dopant concentration different from each other can be achieved by providing diffusion barrier layers (e.g., diffusion barrier layers $1475_1$-$1475_3$ shown in FIGS. 14A-14C) with thicknesses different from each other between respective gate barrier layers $128_1$-$128_3$ and the dopant source layer (shown in FIGS. 14A-14C). The different thicknesses of diffusion barrier layers can vary the amount of dopants diffused from the dopant source layer to each of gate barrier layers $128_1$-$128_1$, and consequently, can selectively adjust the dopant concentration in each of gate barrier layers $128_1$-$128_3$. In some embodiments, the different thicknesses of diffusion barrier layers $1475_1$-$1475_3$ on respective gate barrier layers $128_1$-$128_3$ can be formed by depositing different number of diffusion barrier sub-layers (e.g., diffusion barrier sub-layers 1170, 1272, 1374) for each of diffusion barrier layers $1475_1$-$1475_3$ as shown and described with reference to FIGS. 11A-13D.

The formation of gate barrier layers $128_1$-$128_3$ can include sequential steps of: (i) blanket depositing, on the structure of FIG. 6A after the formation of dielectric stacks within gate openings $612_1$-$612_4$, a layer of barrier material 1068 (shown in FIGS. 10A-10D), which can be doped in subsequent steps to form gate barrier layers $128_1$-$128_3$; (ii) forming diffusion barrier layers $1475_1$-$1475_3$ (shown in FIGS. 14A-14D) on respective portions of layer of barrier material 1068 within gate openings $612_1$-$612_1$; and (iii) doping the respective portions of layer of barrier material 1068 through diffusion barrier layers $1475_1$-$1475_3$.

As shown in FIGS. 10A-10D, layer of barrier material 1068 can be deposited on oxide capping layer 966 (or on gate dielectric layer 112B in the absence of oxide capping layer 966). In some embodiments, layer of barrier material 1068 can include Ti, Ta, TiN, TaN, or other suitable diffusion barrier materials and can be blanket deposited by a CVD process or an ALD process to form substantially conformal layers within gate openings $612_1$-$612_4$. In some embodiments, layer of barrier material 1068 can include a TaN layer with a thickness ranging from about 5 Å to about 15 Å and can be deposited by a CVD process or an ALD process using titanium tetrachloride ($TiCl_4$) and ammonia ($NH_3$). In some embodiments, following the blanket deposition of layer of barrier material 1068, native oxide on layer of barrier material 1068 can be removed using a dry etching process to provide good adhesion of subsequently formed layers on layer of barrier material 1068 and/or to provide reliable control of dopant diffusion, such as Al diffusion, during doping of layer of barrier material 1068 in subsequent steps. In some embodiments, the dry etching process for removing the native oxide can include using etchants, such as tantalum chloride ($TaCl_5$) at a temperature ranging from about 400° C. to about 500° C.

The formation of diffusion barrier layers $1475_1$-$1475_3$ (shown in FIGS. 14A-14D) can include sequential steps of: (i) selectively forming diffusion barrier sub-layer 1170 on the portion of layer of barrier material 1068 within gate opening $612_3$ as described with reference to FIGS. 11A-11D; (ii) selectively forming diffusion barrier sub-layer 1272 on diffusion barrier sub-layer 1170 and on the portion of layer of barrier material 1068 within gate opening $612_2$ as described with reference to FIGS. 12A-12D, and (iii) selectively forming diffusion barrier sub-layer 1374 on diffusion barrier sub-layers 1272 within gate opening $612_2$-$612_3$ and on the portion of layer of barrier material 1068 within gate opening $612_1$ as described with reference to FIGS. 13A-13D. As such, the portion of layer of barrier material 1068 within gate opening $612_3$ can have a thicker diffusion barrier layer $1475_3$ with three diffusion barrier sub-layers 1170, 1272, and 1374 than diffusion barrier layer $1475_2$ with two diffusion barrier sub-layers 1272 and 1374, which is thicker than diffusion barrier layer $1475_1$ with one diffusion barrier sub-layer 1374.

The process for selectively forming diffusion barrier sub-layer 1170 can include blanket depositing the material(s) for diffusion barrier sub-layer 1170 substantially conformally on the structure of FIG. 6A after the native oxide removal from layer of barrier material 1068 within gate openings $612_1$-$612_4$. In some embodiments, the material(s) for diffusion barrier sub-layer 1170 can include a nitride layer (e.g., SiN, TiN) and can be deposited with an ALD process using precursors (e.g., $SiH_4$, $TiCl_4$) and $NH_3$ at a deposition temperature ranging from about 400° C. to about 450° C. at a pressure ranging from about 2 torr to about 10 torr. In some embodiments, the material(s) for diffusion barrier sub-layer 1170 can be deposited with a thickness $1170_t$ ranging from about 5 Å to about 10 Å by depositing the material(s) for diffusion barrier sub-layer 1170 in an ALD process of about 20 cycles to about 25 cycles, where one cycle can include sequential periods of: (i) first precursor gas (e.g., $SiH_4$, $TiCl_4$) flow, (ii) a first purging process, (iii) a second precursor gas (e.g., $NH_3$) gas flow, and (iv) a second purging process. The blanket deposition can be followed by a patterning and an etching process to selectively remove the portions of the material(s) for diffusion barrier sub-layer 1170 from gate openings $612_1$-$612_2$ and $612_4$, while protecting the portion of the material(s) for diffusion barrier sub-layer 1170 within gate opening $612_3$ to form the structures shown in FIGS. 11A-11D. In some embodiments, the etching process can include a wet etching process using an SC1 solution or an SC2 solution.

The process for selectively forming diffusion barrier sub-layer 1272 can include blanket depositing the material(s) for diffusion barrier sub-layer 1272 substantially conformally on the structure of FIG. 6A after the formation of diffusion barrier sub-layer 1170 within gate opening $612_3$. In some embodiments, the material composition, thickness $1272_t$, and the deposition process of diffusion barrier sub-layer 1272 can be similar to that of diffusion barrier sub-layer 1170 described above. The blanket deposition of the material(s) for diffusion barrier sub-layer 1272 can be followed by a patterning and an etching process to selectively remove the portions of the material(s) for diffusion barrier sub-layer 1272 from gate openings $612_1$ and $612_4$, while protecting the portions of the material(s) for diffusion barrier sub-layer 1272 within gate openings $612_2$-$612_3$ to form the structures shown in FIGS. 12A-12D.

The process for selectively forming diffusion barrier sub-layer 1374 can include blanket depositing the material(s) for diffusion barrier sub-layer 1374 substantially conformally on the structure of FIG. 6A after the formation of diffusion barrier sub-layer 1272 within gate openings $612_2$-$612_3$. In some embodiments, the material composition, thickness $1374_t$, and the deposition process of diffusion barrier sub-layer 1374 can be similar to that of diffusion barrier sub-layer 1170 described above. The blanket deposition of the material(s) for diffusion barrier sub-layer 1374 can be followed by a patterning and an etching process to selectively remove the portions of the material(s) for diffusion barrier sub-layer 1374 from gate opening $612_4$, while protecting the portions of the material(s) for diffusion barrier sub-layer 1374 within gate openings $612_1$-$612_3$ to form the structures shown in FIGS. 13A-13D.

Though diffusion barrier layers $1475_1$-$1475_3$ are shown to have one, two, and three diffusion barrier sub-layers, respectively, diffusion barrier layers $1475_1$-$1475_3$ can have any number of diffusion barrier sub-layers similar to diffusion barrier sub-layer 1170, 1272, or 1374. In some embodiments, diffusion barrier sub-layer 1170, 1272, or 1374 can have different thickness from each other. In some embodiments, diffusion barrier layers $1475_1$-$1475_3$ can have different thickness from each other.

Referring to FIGS. 14A-14D, the process for doping the respective portions of layer of barrier material 1068 through diffusion barrier layers $1475_1$-$1475_3$ can include sequential steps of: (i) selectively removing the portion of layer of barrier material 1068 from within gate opening $612_4$; (ii) selectively forming a nucleation layer 1476 within gate openings $612_1$-$612_3$; (iii) selectively forming a dopant source layer 1478 on nucleation layer 1476 within gate openings $612_1$-$612_3$; (iv) forming a nitride capping layer 1480 on dopant source layer 1478 within gate openings $612_1$-$612_3$ and on the dielectric stack within gate opening $612_4$; (v) performing a fourth spike annealing process to drive dopants into the respective portions of layer of barrier material 1068 through diffusion barrier layers $1475_1$-$1475_3$; and (vi) removing nucleation layer 1476, dopant source layer 1478, and nitride capping layer 1480.

The process for selectively removing the portion of layer of barrier material 1068 from within gate opening $612_4$ can include an etching process using diffusion barrier layers $1475_1$-$1475_3$ as hard mask layers to protect the portions of layer of barrier material 1068 within gate openings $612_1$-$612_3$ during the etching process. In some embodiments, the etching process can include a dry etching process at a temperature ranging from about 400° C. to about 500° C. using a tungsten-based etchant, such as $WCl_5$ gas for a time period ranging from about 50 seconds to about 150 seconds. In some embodiments, the etching process can further include flowing a titanium-based gas, such as $TiCl_4$, over top surfaces of diffusion barrier layers $1475_1$-$1475_3$ within gate openings $612_1$-$612_3$. Due to the use of a titanium-based gas, the top surfaces of diffusion barrier layers $1475_1$-$1475_3$ can have a titanium-rich surface, which can facilitate the selective formation of nucleation layer 1476 in subsequent process steps. In some embodiments, a chemical composition of the top surfaces of diffusion barrier layers $1475_1$-$1475_1$ can have a metal composition greater than about 50 atomic percent after the process of selectively removing the portion of layer of barrier material 1068 from within gate opening $612_4$.

The process for selectively forming nucleation layer 1476 on diffusion barrier layers $1475_1$-$1475_3$ within gate openings $612_1$-$612_3$ can include depositing a silicon-based layer, such as an amorphous silicon layer with a thickness $1476_t$ ranging from about 1 Å to about 10 Å using a $SiH_4$ soaking process or a CVI) process with $SiH_4$ as a precursor at a temperature ranging from about 400° C. to about 500° C. for a time period ranging from about 180 seconds to about 400 seconds. In some embodiments, the process for selectively forming nucleation layer 1476 can follow the process for selectively removing the portion of layer of barrier material 1068 without a vacuum break (e.g., the deposition of nucleation layer 1476 can be an in-situ deposition process.) In some embodiments, as the top surfaces of diffusion barrier layers $1475_1$-$1475_3$ have a titanium-rich surface, the silicon-based layer of nucleation layer 1476 can be selectively deposited on diffusion barrier layers $1475_1$-$1475_3$ without depositing on the dielectric stack within gate opening $612_4$ as shown in FIGS. 14A-14D. The titanium-rich surfaces of diffusion barrier layers $1475_1$-$1475_3$ can help to promote growth of nucleation layer 1476 on of diffusion barrier layers $1475_1$-$1475_3$.

The process for selectively forming a dopant source layer 1478 can include blanket depositing, substantially conformally on the structure of FIG. 6A after the formation of nucleation layer 1476 within gate openings $612_1$-$612_3$, a material with a work function value different from the work function value of layer of barrier material 1068 and with a thickness ranging from about 10 Å to about 25 Å. This deposition can be an in-situ deposition process (e.g., following the process of selectively forming nucleation layer without a vacuum break). In some embodiments, the blanket deposited material of dopant source layer 1478 can include a metal, such as Al, which can have a lower work function value than layer of barrier material 1068 (e.g., TaN, TiN). In some embodiments, dopant source layer 1478 can be deposited using a CVD process a temperature ranging from about 200° C. to about 250° C. using an Al precursor (e.g., DimethylaluminumHydride (DMAH)). Since nucleation layer 1476 can have a silicon-rich surface, the material (e.g., Al) of dopant source layer 1478 can selectively bond with the material of nucleation layer 1476 and as a result, dopant source layer 1478 can be selectively formed within gate openings $612_1$-$612_3$, without forming on the dielectric stack within gate opening $612_4$ as shown in FIGS. 14A-14D.

The process for forming nitride capping layer 1480 can include blanket depositing a nitride material (e.g. SiN, TiN) substantially conformally on the structure of FIG. 6A after the formation of dopant source layer 1478 within gate openings $612_1$-$612_3$. Nitride capping layer 1480 can be an oxygen diffusion barrier to prevent dopant source layer 1478 from oxidizing during subsequent annealing process. In some embodiments, the nitride material of nitride capping layer 1480 can be deposited using a CVD or a PECVD process. In some embodiments, the nitride material of nitride capping layer 1480 can be deposited with a thickness ranging from about 1 Å to about 10 Å with an ALD process using precursors (e.g., $SiH_4$, $TiCl_4$) and $NH_3$ at a deposition temperature ranging from about 400° C. to about 450° C. at a pressure ranging from about 2 torr to about 10 torr. The deposition of nitride capping layer 1480 can be an in-situ deposition process.

The fourth spike annealing process can be performed in a $H_2$ ambient at an annealing temperature ranging from about 400° C. to about 500° C. to diffuse (e.g., drive in) dopants (e.g., Al dopants) from dopant source layer 1478 through diffusion barrier layers $1475_1$-$1475_3$ to selectively dope the underlying gate barrier layers $128_1$-$128_3$, respectively, with different doping concentrations. The doping concentration can be lower in gate barrier layer $128_3$ than gate barrier layers $128_1$-$128_2$ and doping concentration can be lower in gate barrier layer $128_2$ than gate barrier layer $128_1$ because diffusion barrier layers $1475_3$ can be thicker on gate harrier layer $128_3$ than diffusion barrier layers $1475_1$-$1475_2$ on respective gate barrier layers $128_1$-$128_2$ and diffusion barrier layers $1475_2$ can be thicker on gate barrier layer $128_2$ than diffusion barrier layers $1475_1$ on gate barrier layer $128_1$. During the fourth spike annealing process oxide capping layers 966 can act as diffusion barriers to block dopants from dopant source layer 1478 from diffusing into gate dielectric layer 112B.

Referring to FIGS. 15A-15D, the process for removing nucleation layer 1476, dopant source layer 1478, and nitride capping layer 1480 can include a wet etching process using an SC1 solution or an SC2 solution that has higher etching selectivity for nucleation layer 1476, dopant source layer 1478, and nitride capping layer 1480 than for gate barrier layers $128_1$-$128_3$, oxide capping layers 966, and gate dielectric layer 112B.

Figure 16A:
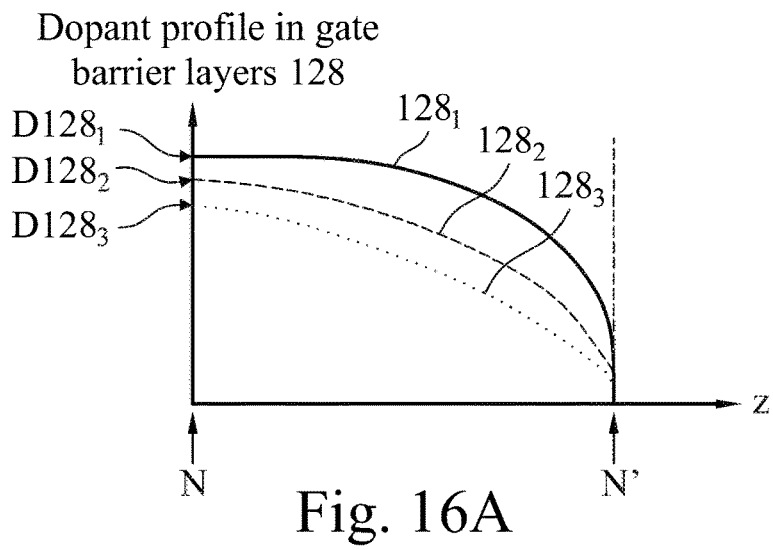
FIG. 16A illustrates dopant distribution profiles in various gate stacks of a semiconductor device, according to some embodiments.
Figure 16B:
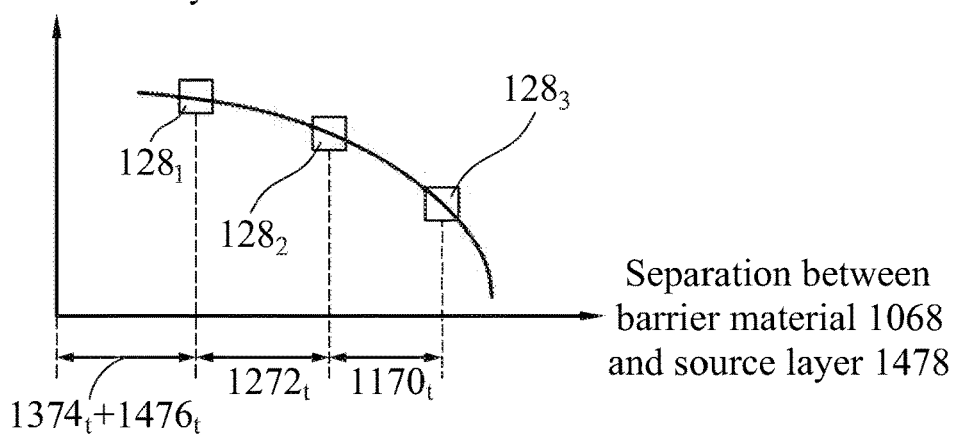
FIG. 16B illustrates average dopant concentration associated with various gate stacks of a semiconductor device, according to some embodiments.
Figure 16C:
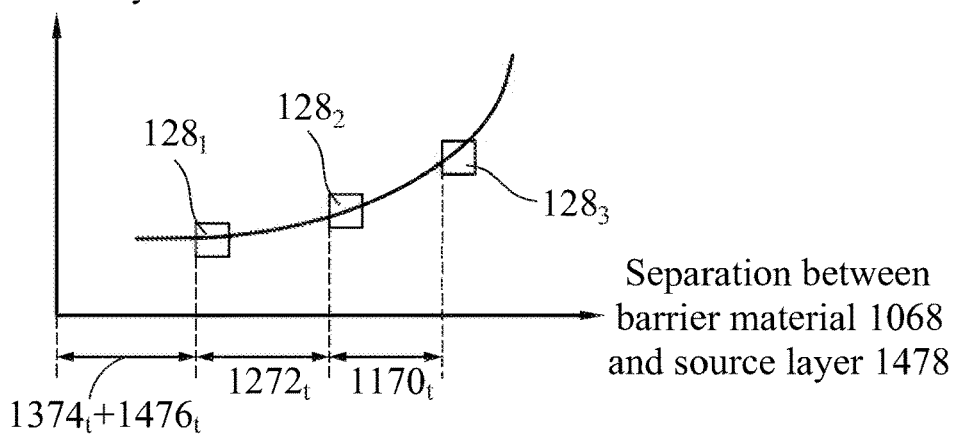
FIG. 16C illustrates work functions associated with various gate stacks of a semiconductor device, according to some embodiments.

After operation 225, gate barrier layers 128₁-128₃ with various doping concentrations can be formed for FETs 102₁-102₃ to respectively provide different work functions as described with references to FIGS. 16A-16C, according to some embodiments. For example, FIG. 16A illustrates exemplary dopant profiles along line M-M' in gate barrier layers 128₁-128₃ of FIGS. 15A-15C. Each dopant profile exhibits dopant distribution between a top surface N (shown in FIGS. 15A-15C) of each gate barrier layers 128₁-128₃ and a bottom surface N' (shown in FIGS. 15A-15C) of each gate barrier layers 128₁-128₃. By way of example and not limitation, the dopant profile of each gate barrier layers 128₁-128₃ can be similar to an error function profile due to the drive in process provided by the fourth spiking annealing process. As previously discussed, diffusion barrier layer 1475₃ can be thicker than diffusion barrier layer 1475₃, and diffusion barrier layer 1475₃ can be thicker than diffusion barrier layer 1475₁. Therefore, a first separation (e.g., $1374_t + 1476_t + 1272_t + 1170_t$) between barrier material 1068 and source layer 1478 associated with gate barrier layer 128₃ can be greater for a second separation (e.g., $1374_t + 1476_t + 1272_1$) between barrier material 1068 and source layer 1478 associated with gate barrier layer 128₂. The second separation (e.g., $1374_t + 1476_t + 1272_t$) between barrier material 1068 and source layer 1478 associated with gate barrier layer 128₂ can be greater for a third separation (e.g., $1374_t + 1476_t$) between barrier material 1068 and source layer 1478 associated with gate barrier layer 128₁. As a result, as shown in FIG. 16A, the doping profile associated with gate barrier layer 128₃ can be throughout lower than the doping profiles associated with gate barrier layers 128₁-128₂, and the doping profile associated with gate barrier layer 128₂ can be throughout lower than the doping profile associated with gate barrier layer 128₁. As such, as shown in FIG. 16B, the average doping concentration can be lower in gate barrier layer 128₃ than in gate barrier layers 128₁-128₂, and the average doping concentration can be lower in gate barrier layer 128₂ than in gate barrier layer 128₁. Accordingly, as shown in FIG. 16C, the work function of gate barrier layer 128₃ can be greater than work functions of gate barrier layers 128₁-128₂, and the work function of gate barrier layer 128₂ can be greater than gate barrier layer 128₁. In some embodiments, a doping concentration D128₁ at gate barrier layer 128₁'s top surface N can be greater a doping concentration D128₂ at gate barrier layer 128₂'s top surface N, and doping concentration D128₂ at gate barrier layer 128₂'s top surface N can be greater a doping concentration D128₃ at gate barrier layer 128₃'s top surface N.

Referring to FIG. 2, in operation 230, gate work function layers and gate metal fill layers are formed with the gate barrier layers. For example, referring to FIGS. 17A-17D, and FIGS. 18A-18B gate work function layer 130 and gate metal fill layer 132 can be formed on the dielectric stack or gate dielectric layer 112B within gate opening 612₄ and on gate barrier layers 128₁-128₃ within gate openings 612₁-612₃. The formation of gate work function layer 130 and gate metal fill layer 132 can include blanket depositing a layer of work function metal for gate work function metal layer 130 on the dielectric stack or gate dielectric layer 112B within gate opening 612₄ and on gate barrier layers 128₁-128₃, followed by blanket depositing a layer of conductive material for gate metal fill layer 132 on the layer of work function metal until gate openings 612₁-612₄ are filled.

The layer of work function metal for work function layer 130 can include Al, Cu, W, Ti, Ta, TiN, TaN, NiSi, CoSi, Ag, TaC, TaSiN, TaCN, TiAl, TiAlN, WN, metal alloys, and/or combinations thereof. The layer of work function metal can be deposited using a suitable process such as ALD, CVD, PVD, plating, or combinations thereof. In some embodiments, the layer of work function metal can be in-situ doped with metal, such as Al, during the deposition of work function layer 130. The layer of conductive material for gate metal fill layer 132 can include a suitable conductive material, such as W and/or fluorine-free tungsten. In some embodiments, gate metal fill layer 132 can be include (i) a first layer of fluorine-free tungsten conformally deposited on work function layer 130 with an ALD process using a tungsten (V) chloride (WCl₅) at a temperature range between about 400° C. and about 480° C. and (ii) a second layer of CVD tungsten deposited on the first layer of fluorine-free tungsten by a CVD process using tungsten hexafluoride (WF₆) and hydrogen (H₂) at a temperature range between about 300° C. and about 400° C. In some embodiments, the fluorine-free tungsten layer can acts as a diffusion barrier for fluorine. In some embodiments, the fluorine-free tungsten can have a thickness ranging from about 3 nm to about 5 nm and the CVD tungsten can have a thickness ranging from about 150 nm to about 200 nm. The deposited layers of work function metal and conductive material can be planarized by a CMP process to form the structure of FIG. 1A. The CMP process can substantially coplanarize top surfaces of gate dielectric layers 112B, gate barrier layers 128₁-128₃, gate work function metal layers 130, and gate metal fill layers 132 with top surface of ILD layer 118 as shown in FIGS. 1A-1C.

The present disclosure provides example structures of FETs (e.g., FETs 102₁-102₄) with nanostructured channel regions (e.g., nanostructured channel regions 122B) and different gate structures (e.g., gate structures 112₁-112₄ configured to provide different threshold voltages and example methods of forming such FETs on the same substrate. The example methods form FETs of different conductivity types with different work function values, and as a result, with different and/or low threshold voltages on the same substrate. Such methods can be less complicated and more cost-effective in manufacturing reliable gate structures in FETs with nanostructured channel regions and with different and/or low threshold voltages than other methods of forming FETs with similar channel dimensions and threshold voltages on the same substrate The embodiments described herein are directed to a method for the fabrication of FETs with metal gate stack, such as gate barrier layers, having different doping concentration from each other. As a result, the work function associated with each FET's gate electrode can be different from each other, thus allowing each FET having different threshold voltages from each other. The example methods can include forming diffusion barrier layers with different thickness on each gate barrier layer of one or more FETs, forming a dopant layer on the diffusion barrier layers, and driving the material from the dopant layer towards the each gate barrier layer through the diffusion barrier layers. Since each diffusion barrier layer can have different thickness from each other, the respective diffusion length can be accordingly different during the doping process. Consequently, different doping concentration can result in each gate barrier layer, thus allowing each FET being configured with different threshold voltage regardless of the constrains of the FET's size.

In some embodiments, a method of fabricating a semiconductor device includes forming first and second stacks of first and second nanostructured layers arranged in an alternating configuration on a substrate, growing first and second epitaxial regions of opposite conductivity type on the first and second stacks, respectively, forming first and second nanostructured channel regions in the first nanostructured layers of the first and second stacks, respectively, forming first and second gate-all-around (GAA) structures wrapped around each of the first and second nanostructured channel regions, respectively. The forming the first and second GAA structures includes forming first and second gate dielectric layers wrapped around the first and second nanostructured channel regions, respectively, depositing first and second gate barrier layers having similar material compositions and work function values on the first and second gate dielectric layers, respectively, forming first and second diffusion barrier layers on the first and second gate barrier layers, respectively, and doping the first and second gate barrier layers simultaneously from a dopant source layer through the first and second diffusion barrier layers, respectively. The first diffusion barrier layer is thicker than the second diffusion barrier layer and wherein the first and second gate barrier layers after the doping includes work function values and doping concentrations different from each other.

In some embodiments, a method of fabricating a semiconductor device includes forming first and second stacks of first and second nanostructured layers arranged in an alternating configuration on a substrate, growing first and second epitaxial regions of opposite conductivity type on the first and second stacks, respectively, forming first and second nanostructured channel regions in the first nanostructured layers of the first and second stacks, respectively, forming first and second gate dielectric layers wrapped around the first and second nanostructured channel regions, respectively, depositing first and second gate barrier layers on the first and second gate dielectric layers, respectively, depositing first and second diffusion barrier layers on the first and second gate barrier layers, respectively, removing the second diffusion barrier layer and the second gate barrier layer, and selectively doping the first gate barrier layer through the diffusion barrier layer.

In some embodiments, a semiconductor device includes first and second stacks of first and second nanostructured layers arranged in an alternating configuration disposed on a substrate, first and second nanostructured channel regions in the first nanostructured layers of the first and second stacks, respectively, and first and second gate-all-around (GAA) structures wrapped around each of the first and second nanostructured channel regions, respectively. The first and second GAA structures includes first and second gate dielectric layers wrapped around the first and second nanostructured channel regions, respectively, and first and second gate barrier layers disposed on the first and second gate dielectric layers wrapped around the first and second nanostructured channel regions, respectively. The first and second gate barrier layers include work function values and doping concentrations different from each other.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
    forming first and second stacks of first and second nanostructured layers arranged in an alternating configuration on a substrate;
    growing first and second epitaxial regions of opposite conductivity type on the first and second stacks, respectively;
    forming first and second nanostructured channel regions in the first nanostructured layers within the first and second stacks, respectively; and
    forming first and second gate-all-around (GAA) structures wrapped around each of the first and second nanostructured channel regions, respectively, wherein the forming the first and second GAA structures comprises:
        forming first and second gate dielectric layers wrapped around the first and second nanostructured channel regions, respectively;
        depositing first and second gate barrier layers having similar material compositions and work function values on the first and second gate dielectric layers, respectively;
        forming first and second diffusion barrier layers on the first and second gate barrier layers, respectively, wherein the first diffusion barrier layer is thicker than the second diffusion barrier layer; and
        doping the first and second gate barrier layers simultaneously from a dopant source layer through the first and second diffusion barrier layers, respectively, wherein the first and second gate barrier layers after the doping comprises work function values and doping concentrations different from each other.

2. The method of claim 1, wherein the forming the first and second diffusion barrier layers comprises:
    depositing a first layer of diffusion barrier material on the first and second gate barrier layers; and
    removing a portion of the first layer of diffusion barrier material on the second gate barrier layer.

3. The method of claim 2, wherein the forming the first and second diffusion barrier layers further comprises depositing a second layer of diffusion barrier material on a portion of the first layer of diffusion barrier material on the first gate barrier layer and on the second gate barrier layer.

4. The method of claim 1, wherein the doping the first and second gate barrier layers comprises:
    depositing a nucleation layer on the first and second diffusion barrier layers; and
    depositing the dopant source layer on the nucleation layer.

5. The method of claim 1, wherein the doping the first and second gate barrier layers comprises:
    depositing the dopant source layer on the first and second diffusion barrier layers; and
    depositing a nitride capping layer on the dopant source layer.

6. The method of claim 1, wherein the doping the first and second gate barrier layers comprises:
    depositing the dopant source layer on the first and second diffusion barrier layers;
    depositing a nitride capping layer on the dopant source layer; and
    performing a spike annealing process on the substrate.

7. The method of claim 1, wherein the forming the first and second GAA structures comprises:
    forming a first gate opening between adjacent first epitaxial regions and a second gate opening between adjacent second epitaxial regions;

depositing the first and second gate barrier layers within the first and second gate openings, respectively; and forming the first and second diffusion barrier layers within the first and second gate openings on the first and second gate barrier layers, respectively.

8. The method of claim 7, wherein the forming the first and second GAA structures further comprises:

forming a third gate opening between adjacent first nanostructured channel regions and a fourth gate opening between adjacent second nanostructured channel regions;

depositing the first and second gate barrier layers within the third and fourth gate openings, respectively; and forming the first and second diffusion barrier layers within the third and fourth gate openings on the first and second gate barrier layers, respectively.

9. The method of claim 1, wherein the forming the first and second GAA structures comprises:

forming a first gate opening between adjacent first nanostructured channel regions and a second gate opening between adjacent second nanostructured channel regions;

depositing the first and second gate barrier layers within the first and second gate openings, respectively; and forming the first and second diffusion barrier layers within the first and second gate openings on the first and second gate barrier layers, respectively.

10. The method of claim 1, wherein the doping the first and second gate barrier layers comprises:

etching oxides from top surfaces of the first and second diffusion barrier layers using a titanium-based etching gas;

depositing a nucleation layer on the first and second diffusion barrier layers; and depositing the dopant source layer on the nucleation layer.

11. A method of fabricating a semiconductor device, the method comprising:

forming first and second stacks of first and second nanostructured layers arranged in an alternating configuration on a substrate;

growing first and second epitaxial regions of opposite conductivity type on the first and second stacks, respectively;

forming first and second nanostructured channel regions in the first nanostructured layers within the first and second stacks, respectively;

forming first and second gate dielectric layers wrapped around the first and second nanostructured channel regions, respectively;

depositing first and second gate barrier layers on the first and second gate dielectric layers, respectively;

depositing first and second diffusion barrier layers on the first and second gate barrier layers, respectively;

removing the second diffusion barrier layer and the second gate barrier layer; and selectively doping the first gate barrier layer through the first diffusion barrier layer.

12. The method of claim 11, wherein the selectively doping the first gate barrier layer comprises:

selectively depositing a nucleation layer on the first barrier layer and not on the second gate dielectric layer; and depositing a dopant source layer on the nucleation layer.

13. The method of claim 12, wherein the selectively doping the first gate barrier layer further comprises:

depositing a nitride capping layer on the dopant source layer and the second gate dielectric layer; and performing a spike annealing process on the nitride capping layer.

14. The method of claim 11, wherein the removing the second gate barrier layer comprises etching the second gate barrier layer using a titanium-based etching gas.

15. The method of claim 11, further comprising:

forming a first gate opening between adjacent first epitaxial regions and a second gate opening between adjacent second epitaxial regions;

depositing the first and second gate barrier layers within the first and second gate openings, respectively; and forming the first and second diffusion barrier layers within the first and second gate openings on the first and second gate barrier layers, respectively.

16. The method of claim 11, further comprising:

forming a first gate opening between adjacent first nanostructured channel regions and a second gate opening between adjacent second nanostructured channel regions;

depositing the first and second gate barrier layers within the first and second gate openings, respectively; and forming the first and second diffusion barrier layers within the first and second gate openings on the first and second gate barrier layers, respectively.

17. A method of fabricating a semiconductor device, the method comprising:

forming a fin structure on a substrate;

forming a sacrificial gate structure on the fin structure;

forming an epitaxial region on the fin structure;

forming a gate opening within the fin structure; and forming a dielectric stack within the gate opening, comprising:

forming an oxide layer;

forming a gate dielectric layer on the oxide layer;

forming an interfacial oxide layer on the gate dielectric layer;

forming an oxide capping layer on the interfacial oxide layer; and forming a gate electrode on the dielectric stack.

18. The method of claim 17, wherein forming the gate barrier electrode comprises:

forming a gate barrier layer:

forming, on the gate barrier layer, a diffusion barrier layer with a thickness;

depositing a dopant source layer on the diffusion barrier layer; and performing a spike annealing process to drive dopants from the dopant source layer, through the diffusion barrier layer, into the gate barrier layer, the doping concentration in the gate barrier layer being determined by the thickness of the diffusion barrier layer.

19. The method of claim 18, wherein forming the gate barrier layer further comprises:

forming a nucleation layer under the dopant source layer; and forming a nitride capping layer over the dopant source layer.

20. The method of claim 17, wherein forming the gate electrode comprises:

forming a gate barrier layer on the dielectric stack, the gate barrier layer having a work function value associated with a doping concentration of the gate barrier layer; and forming a gate work function layer and a gate metal fill layer on the gate barrier layer.

* * * * *